United States Patent
Chen et al.

(10) Patent No.: US 8,405,392 B2
(45) Date of Patent: Mar. 26, 2013

(54) CORRECTED NUCLEAR MAGNETIC RESONANCE IMAGING USING MAGNETIZATION TRANSFER

(75) Inventors: Jin-Hong Chen, Forest Hills, NY (US); Samuel Singer, New York, NY (US)

(73) Assignee: Sloan Kettering Institute for Cancer Research, New York, NY (US)

( * ) Notice: Subject to any disclaimer, the term of this patent is extended or adjusted under 35 U.S.C. 154(b) by 518 days.

(21) Appl. No.: 12/643,235

(22) Filed: Dec. 21, 2009

(65) Prior Publication Data
US 2010/0156413 A1 Jun. 24, 2010

Related U.S. Application Data

(60) Provisional application No. 61/139,437, filed on Dec. 19, 2008.

(51) Int. Cl.
*G01V 3/00* (2006.01)
(52) U.S. Cl. ........................................ 324/307
(58) Field of Classification Search ........... 324/300–322
See application file for complete search history.

(56) References Cited

U.S. PATENT DOCUMENTS

| | | | | |
|---|---|---|---|---|
| 4,885,542 A | * | 12/1989 | Yao et al. | 324/313 |
| 5,262,725 A | * | 11/1993 | Cuppen et al. | 324/312 |
| 7,417,430 B2 | * | 8/2008 | Aldefeld et al. | 324/309 |

OTHER PUBLICATIONS

Balaban, R. et al., Magnetization Transfer Contrast in Magnetic Resonance Imaging, journal, Magnetic Resonance Quarterly, 1992, pp. 116-137, vol. 8, No. 2, Raven Press, Ltd., New York, United States.

Chen, J. et al., High-Resolution MAS NMR Spectroscopy Detection of the Spin Magnetization Exchange by Cross-Relaxation and Chemical Exchange in Intact Cell Lines and Human Tissue Specimens, journal, Magnetic Resonance in Medicine, 2006, pp. 1246-1256, Wiley-Liss, Inc., United States.

Dixon, T., Simple Proton Spectroscopic Imaging, journal, Radiology, May 1984, pp. 189-194, vol. 153, No. 1, RSNA.

Frahm, J. et al., Chemical Shift Selective MR Imaging Using a Whole-Body Magnet, journal, Radiology, Mar. 1985, pp. 441-444, vol. 156, No. 2, RSNA.

Glover, G. et al., Three-Point Dixon Technique for True Water/Fat Decomposition with B0 Inhomogeneity Correction, journal, Magnetic Resonance in Medicine, Apr. 1990, pp. 371-383, Academic Press, Inc., United States.

Henkelman, R. et al., Magnetization transfer in MRI: a review, journal, NMR in Biomedicine, Oct. 2000, pp. 57-64, vol. 14, No. 2, John Wiley & Sons, Ltd.

Hoult, D., Solvent Peak Saturation with Single Phase and Quadrature Fourier Transformation, journal, Journal of Magnetic Resonance, Jun. 1975, pp. 337-347, vol. 21, No. 2, Academic Press, Great Britain.

(Continued)

*Primary Examiner* — Dixomara Vargas
(74) *Attorney, Agent, or Firm* — Evans & Molinelli PLLC; Eugene J. Molinelli

(57) ABSTRACT

Techniques for corrected nuclear magnetic resonance (NMR) data include applying a presaturation radio frequency (RF) magnetic field different from a fat molecule resonance for a particular time to a target tissue; and applying a first measurement RF magnetic field within a first time after the particular time. Correction nuclear magnetic resonance (NMR) data from the target tissue is determined based on first NMR data received in response to applying the first measurement RF magnetic field. In some embodiments, a second measurement RF magnetic field is also applied in a second time different from both the particular time and the first time. Corrected NMR data is determined by subtracting the correction NMR data from second NMR data received in response to applying the second measurement RF magnetic field. Among other applications, these techniques allow distinguishing either fat or proteins in edemas, or both, from proteins in other tissues.

22 Claims, 12 Drawing Sheets

OTHER PUBLICATIONS

Keller, P. et al., Multisection Fat-Water Imaging with Chemical Shift Selective Presaturation, journal, Radiology, Mar. 1987, pp. 539-541, vol. 164, No. 2, RSNA.

Muller, R. et al., True 3-D Imaging of Limbs by NMR Zeugmatography with Off-Resonance Irradiation, journal, Europ. J. Radiol., 1983, pp. 286-290, Georg Thieme Verlag Stuttgart, New York, United States.

Schick, F. et al., Highly Selective Water and Fat Imaging Applying Multislice Sequences without Sensitivity to B1 Field Inhomogeneities, journal, Feb. 1997, pp. 269-274, Williams & Wilkins.

Schick, F. et al., Localized Larmor Frequency-Guided Fat and Water Proton MRI of the Spine: A Method to Emphasize Pathological Findings, journal, Magnetic Resonance Imaging, Mar. 1991, pp. 509-515, vol. 9, No. 4, Pergamon Press, United States.

* cited by examiner

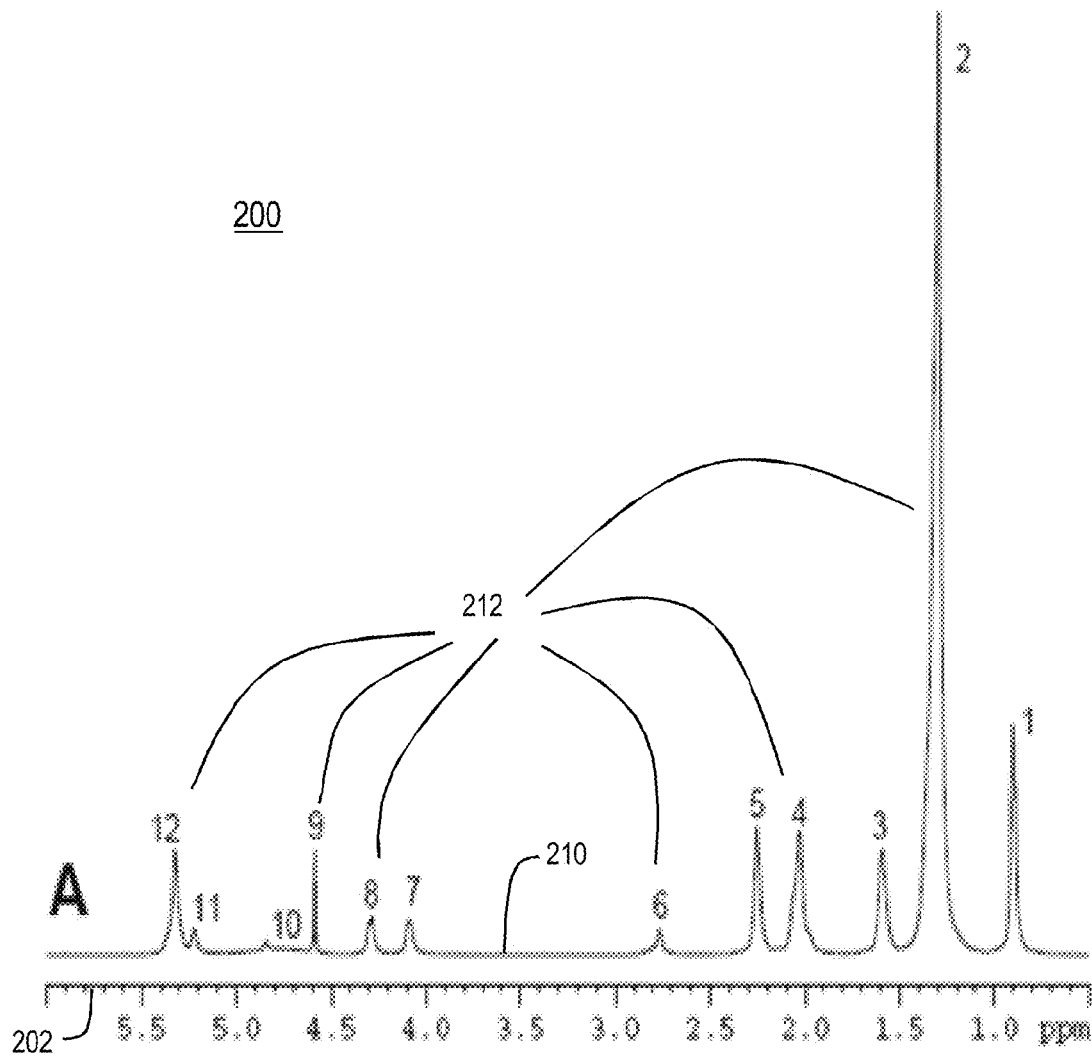
FIG. 2A
FIG. 2B
Assignment of proton spectrum on one chain of fat triglyceride
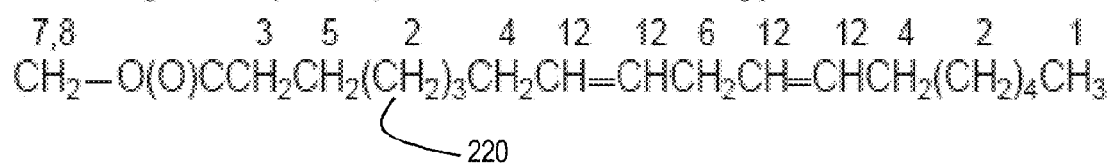

FIG. C

731 SMALL BOWEL
732 SPLEEN
733 LIVER  734 KIDNEY  736 PANCREAS
735 SPINE  737 COLON

FIG. 8A
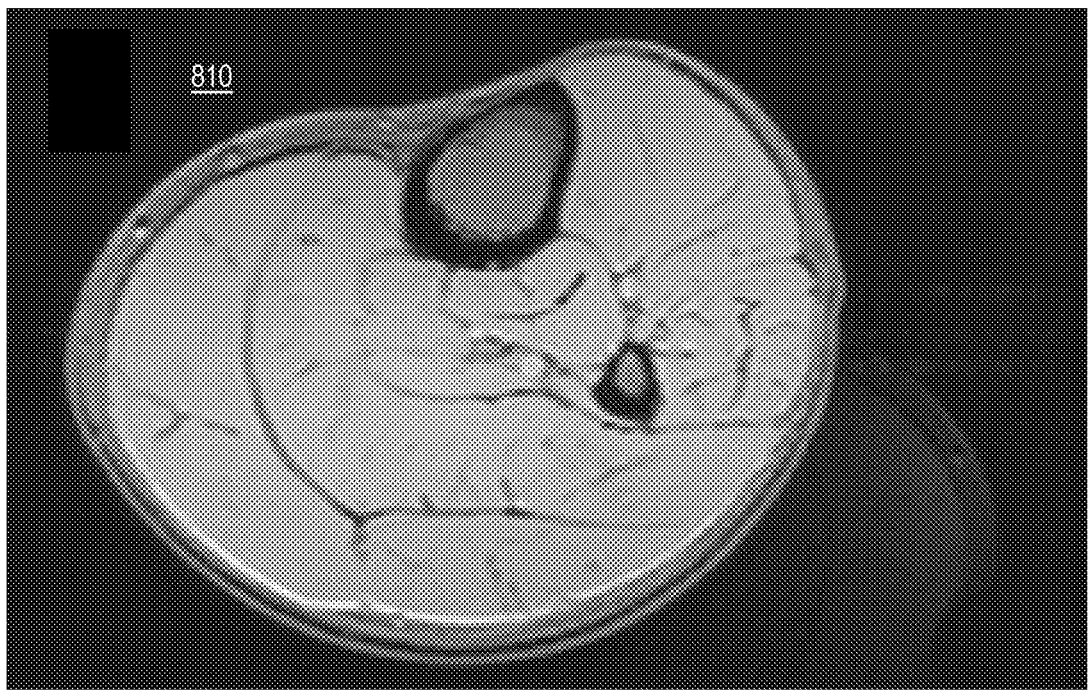
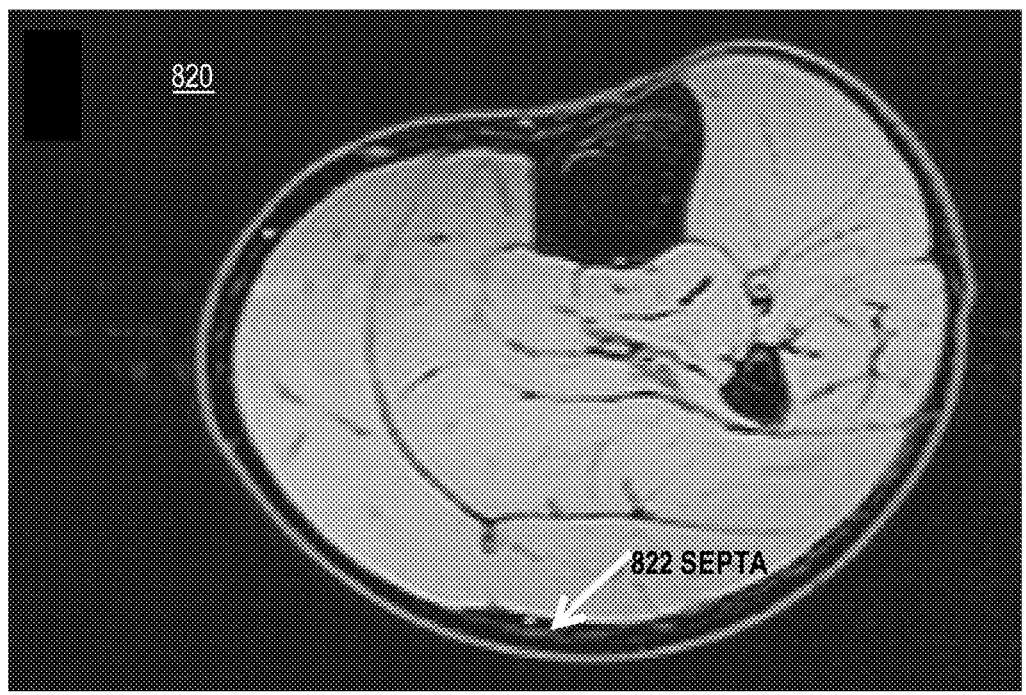
FIG. 8B

FIG. 9A
FIG. 9B
FIG. 9C
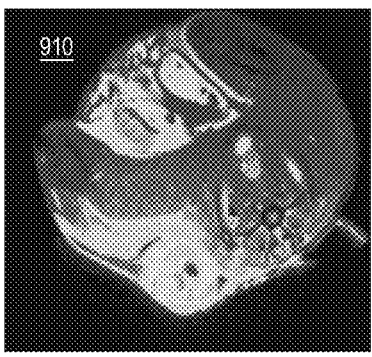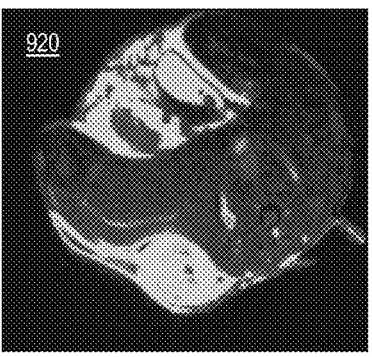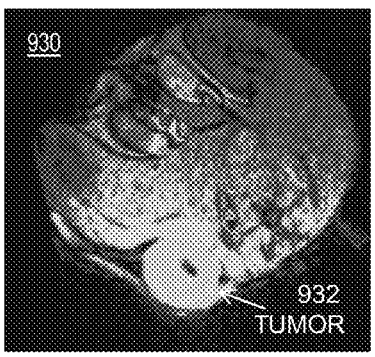
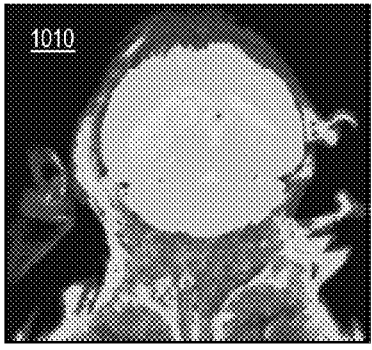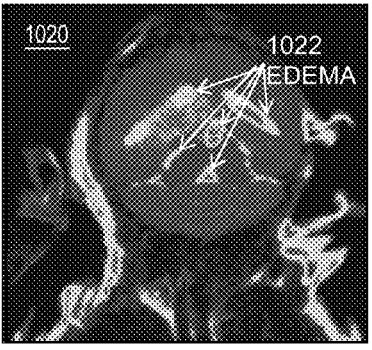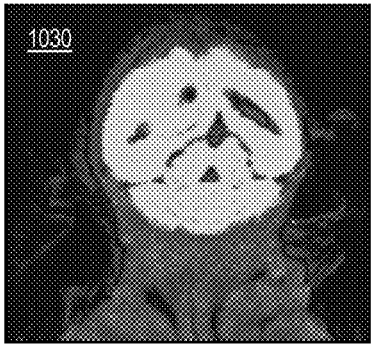
FIG. 10A
FIG. 10B
FIG. 10C

US 8,405,392 B2

CORRECTED NUCLEAR MAGNETIC RESONANCE IMAGING USING MAGNETIZATION TRANSFER

CROSS-REFERENCE TO RELATED APPLICATIONS

This application claims benefit of Provisional Appln. 61/139,437, filed Dec. 19, 2008, the entire contents of which are hereby incorporated by reference as if fully set forth herein, under 35 U.S.C. §119(e).

STATEMENT OF GOVERNMENTAL INTEREST

This invention was made with Government support under Contract No PO1 CA047179 awarded by the National Institutes of Health. The Government has certain rights in the invention.

BACKGROUND OF THE INVENTION

1. Field of the Invention

The present invention relates to magnetic resonance imaging (MRI) and magnetic resonance spectral imaging (MRSI).

2. Description of the Related Art

Suppression of nuclear magnetic resonance (NMR) signals from fat molecules in a human or animal subject is useful in discerning and interpreting structures in MRI and MRSI imagery of the subject. Several techniques for suppression of the signals from fat have been employed in the prior art, and have been found useful in the medical arts.

However, each of these techniques suffer one or more deficiencies, such as failing to completely eliminate the signals from fat molecules or requiring a precisely known or homogeneous steady state magnetic field (B0) or radio-frequency field ($B_1$), or some combination.

SUMMARY OF THE INVENTION

Techniques are provided for generating nuclear magnetic resonance signals that display corrected structure in a target tissue without all the deficiencies of prior art approaches to remove signals from fat molecules.

In one set of embodiments a method includes applying a presaturation radio frequency (RF) magnetic field at a particular frequency different from a fat molecule resonance for a particular time to a target tissue. The method also includes applying a first measurement RF magnetic field within a first time after the particular time. Correction nuclear magnetic resonance data from the target tissue is determined based on first nuclear magnetic resonance data received in response to applying the first measurement RF magnetic field.

In some of these embodiments, the method further includes applying a second measurement RF magnetic field in a second time different from both the particular time and the first time. Corrected nuclear magnetic resonance data is determined by subtracting the correction nuclear magnetic resonance data from second nuclear magnetic resonance data received in response to applying the second measurement RF magnetic field.

In other sets of embodiments an apparatus or computer readable storage medium is configured to perform one or more steps of the above method.

BRIEF DESCRIPTION OF THE DRAWINGS

The present invention is illustrated by way of example, and not by way of limitation, in the figures of the accompanying drawings and in which like reference numerals refer to similar elements and in which:

FIG. 2A is a graph that depicts the NMR spectrum of human fat tissue (comprising triglyceride);

FIG. 2B is a diagram of a triglyceride molecule identifying the locations of protons that cause peaks depicted in FIG. 2A;

FIG. 6A and FIG. 6B and FIG. 6C are graphs that illustrate the NMR spectra and difference, respectively, of two NMR signals from a target tissue, according to another embodiment;

FIG. 8A and FIG. 8B are graphs that illustrated uncorrected and corrected NMR imagery for a human subject, according to an embodiment;

FIG. 9A and FIG. 9B and FIG. 9C are graphs that illustrate an NMR image, an NMR correction image and difference, respectively, of two NMR signals to distinguish edemas in malignant peripheral nerve sheath tumor (MPNST) tissue, according to another embodiment;

FIG. 10A and FIG. 10B and FIG. 10C are graphs that illustrate an NMR image, an NMR correction image and difference, respectively, of two NMR signals to distinguish edemas in glioma, according to another embodiment;

DETAILED DESCRIPTION

Figure 1:
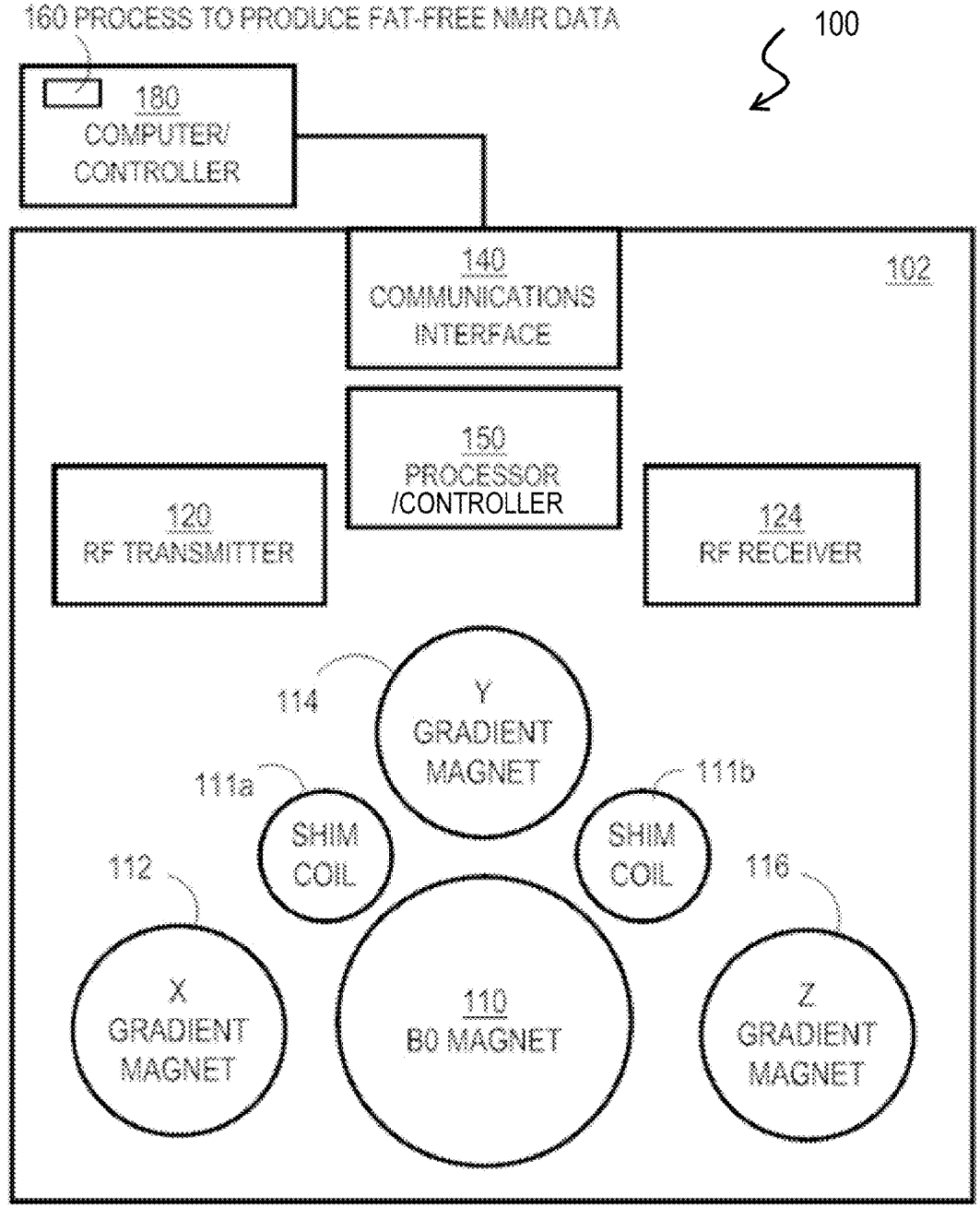
FIG. 1 is a block diagram that illustrates a system for producing corrected NMR data, according to an embodiment.

Techniques are described for generating nuclear magnetic resonance data that display corrected structure in a target tissue. In the following description, for the purposes of explanation, numerous specific details are set forth in order to provide a thorough understanding of the present invention. It will be apparent, however, to one skilled in the art that the present invention may be practiced without these specific details. In other instances, well-known structures and devices are shown in block diagram form in order to avoid unnecessarily obscuring the present invention.

Some embodiments of the invention are described below in the context of imagery of proteins and membrane phospholipids. However, the invention is not limited to this context. In other embodiments other molecules are contrasted from fat molecules or other tissue components in NMR images of a target tissue. In some embodiments, the target tissue is a sample removed from a living organism, but in some embodiments, the target tissue is all or part of the living organism, such as a human or animal.

1. Overview

Nuclear magnetic resonance (NMR) studies magnetic nuclei by aligning them with an applied constant magnetic field ($B_0$) and perturbing this alignment using an alternating magnetic field ($B_1$), orthogonal to the constant magnetic field. The resulting response to the perturbing magnetic field is the phenomenon that is exploited in magnetic resonance spectroscopy (MRS) and magnetic resonance imaging (MRI).

The elementary particles, neutrons and protons, composing an atomic nucleus, have the intrinsic quantum mechanical property of spin. The overall spin of the nucleus is determined by the spin quantum number I. If the number of both the protons and neutrons in a given isotope are even, then I=0. In other cases, however, the overall spin is non-zero. A non-zero spin is associated with a non-zero magnetic moment, $\mu$, as given by Equation 1a.

$$\mu = \gamma I \quad (1a)$$

where the proportionality constant, $\gamma$, is the gyromagnetic ratio. It is this magnetic moment that is exploited in NMR. For example, nuclei that have a spin of one-half, like Hydrogen nuclei ($^1H$), a single proton, have two possible spin states (also referred to as up and down, respectively). The energies of these states are the same. Hence the populations of the two states (i.e. number of atoms in the two states) will be approximately equal at thermal equilibrium. If a nucleus is placed in a magnetic field, however, the interaction between the nuclear magnetic moment and the external magnetic field means the two states no longer have the same energy. The energy difference between the two states is given by Equation 1b.

$$\Delta E = \hbar \gamma B_0 \quad (1b)$$

where $\hbar$ is Planck's reduced constant. Resonant absorption will occur when electromagnetic radiation of the correct frequency to match this energy difference is applied. The energy of photons of electromagnetic radiation is given by Equation 2.

$$E = hf \quad (2)$$

where f is the frequency of the electromagnetic radiation and $h = 2\pi\hbar$. Thus, absorption will occur when the frequency is given by Equation 3.

$$f = \gamma B_0 / (2\pi) \quad (3)$$

The NMR frequency f is shifted by the 'shielding' effect of the surrounding electrons. In general, this electronic shielding reduces the magnetic field at the nucleus (which is what determines the NMR frequency). As a result, the energy gap is reduced, and the frequency required to achieve resonance is also reduced. This shift of the NMR frequency due to the chemical environment is called the chemical shift, and it explains why NMR is a direct probe of chemical structure. The chemical shift in absolute terms is defined by the frequency of the resonance expressed with reference to a standard which is defined to be at 0. The scale is made more manageable by expressing it in parts per million (ppm) of the standard frequency.

Applying a short electromagnetic pulse in the radio frequency (RF) range to a set of nuclear spins simultaneously excites all the NMR transitions. In terms of the net magnetization vector, this corresponds to tilting the magnetization vector away from its equilibrium position (aligned along the external magnetic field, $B_0$). The out-of-equilibrium magnetization vector precesses about the external magnetic field at the NMR frequency of the spins. This oscillating magnetization induces a current in a nearby pickup coil acting as a radio frequency (RF) receiver, creating an electrical signal oscillating at the NMR frequency. A portion of this time domain signal (intensity vs. time) is known as the free induction decay (FID) and contains the sum of the NMR responses from all the excited spins. In order to obtain the frequency-domain NMR spectrum (intensity vs. frequency) for magnetic resonance spectroscopy (MRS) and MRS imaging (MRSI), this time-domain signal is Fourier transformed to a frequency domain signal.

A typical NMR measurement does not substantially alter the system under study. The nuclear spins, once promoted to the higher energy level, quickly return to the lower energy level by some route. This process of returning to the pre-experiment condition is called relaxation. If the relaxation is quick, the peak areas reflect the number of contributing nuclei. If the relaxation is slow or the signal strength great enough and persistent enough, nuclei are promoted to the higher energy spin state faster than they can leave it. Eventually the population excess of the lower energy level will be depleted and the two populations will become the same. This is called saturation. As the system begins to saturate, the NMR signal will diminish in intensity and at full saturation will disappear.

Magnetization transfer (MT) refers to the transfer or exchange of longitudinal magnetization between free water protons and protons of tissue protein, membrane phospholipids and any non-mobile molecules that retain their alignment with respect to the applied magnetic fields.

The inventors recognized that MT from water to protons in molecules of structural interest in a tissue sample, such as proteins and membrane lipids, and MT from fats to these same protons, are different; and provide an opportunity to remove the fat signal from NMR measurements. The inventors' approach, furthermore, does not suffer one or more of the disadvantages of prior art approaches, as explained in more detail below.

According to example embodiments described in more detail below, saturation of the protons in molecules of interest with which water has a high MT but fat has a low MT can be used to produce signals that allow the removal of fat signals in NMR data. Since the saturation occurs before making an NMR measurement, this kind of saturation is called presaturation, herein.

The NMR signal from fat distorts measurements of NMR signals from tissues encompassed by fat or nearby, such as tissues in the liver, skin and bone marrow, as described in more detail in a later section. Other approaches to removing the fat signal are incomplete or rely on precise knowledge of the magnetic fields that is often not available.

2. Systems for Producing Corrected NMR Data

FIG. 1 is a block diagram that illustrates an example MRS system 100, according to an embodiment. The system 100 includes a scanning apparatus 102 and a computer/external controller 180. Although a subject 190 (including target tissue) for MRS scanning is depicted in FIG. 1, subject 190 is not part of the MRS system 100.

The scanning apparatus 102 includes a $B_0$ magnet 110, an x-gradient magnet 112, a y-gradient magnet 114, a z-gradient magnet 116, a group of shim coils (e.g., shim coils 111a and 111b), a radio frequency (RF) transmitter 120, an RF receiver 124, a communications interface 140, and a processor/internal controller 150. The gradient magnets are used for spatial sampling (slices and pixels within slices). As depicted, the components of scanner 102 are standard and well known in the art.

The computer/controller 180 sends signals to the communications interface 140 in scanner 102 that causes the scanner to operate the gradient magnets 112, 114 and 116 and the RF transmitter 120 and RF receiver 124 to obtain NMR data.

In the illustrated embodiment, computer/controller 180 includes process 160 to produce corrected NMR data, such as fat-free NMR data. Process 160 performs one or more steps of method depicted in FIG. 4. For example, process 160 causes scanner 102 to presaturate certain protons using RF transmitter 120 and also send measurement signals using RF transmitter 120 to collect data via RF receiver 124. The collected data is received at computer/controller 180 or another computer and used to determine corrected MRI images or MRSI spectra, using additional steps of the method of FIG. 4.

In some embodiments, process 160 is performed by processor/internal controller 150 within scanner 102. In various embodiments, one or more steps of method 400 are performed by multiple processors on scanner 102 or computer/controller 180, such as the computer system depicted in FIG. 11, or other computers connected to computer/controller 180 via a network, or a chip set as depicted in FIG. 12.

3. Fat Molecule Signals

Water and fat (triglyceride) are the two major signal sources in magnetic resonance imaging (MRI). A major source of contamination of signals from proteins is shielding from protons in fat molecules, which is especially problematic in fatty tissues, such as liver, myelin sheaths, and skin, among many others. FIG. 2A is a graph 200 that depicts the NMR spectrum 210 of human fat tissue (comprising triglyceride). This fat tissue sample was measured in a capillary tube. The horizontal axis 202 is frequency shift from the driving RF, e.g., 600,000,000 Hertz, in parts per million (ppm). The vertical axis (not shown) is amplitude in arbitrary units of received signal. Spectral peaks 212 are enumerated from 1 to 12 in order of increasing frequency shift. FIG. 2B is a diagram of one chain of a triglyceride molecule 220 identifying the location of protons that cause some of the peaks 212 depicted in FIG. 2A. Peaks 9, 10 and 11 are not shown in FIG. 2B. Peak 10 is from water in the tissue. Peak 9 is the residual water in $D_2O$ in a capillary tube that was placed parallel to a tissue sample tube. Peak 11 is from a glycerol proton of the middle triglyceride chain (not shown FIG. 2B). The water signal (peak 10 and a small fairly broad peak under peak 10) from the sample was very small compared to the strong fat signals. The major methylene peak (peak 2) accounted for 59% of all fat signals in this sample. The vinyl signal (peak 12) intensity was approximately 11% of the intensity of peak 2.

Figure 2C:
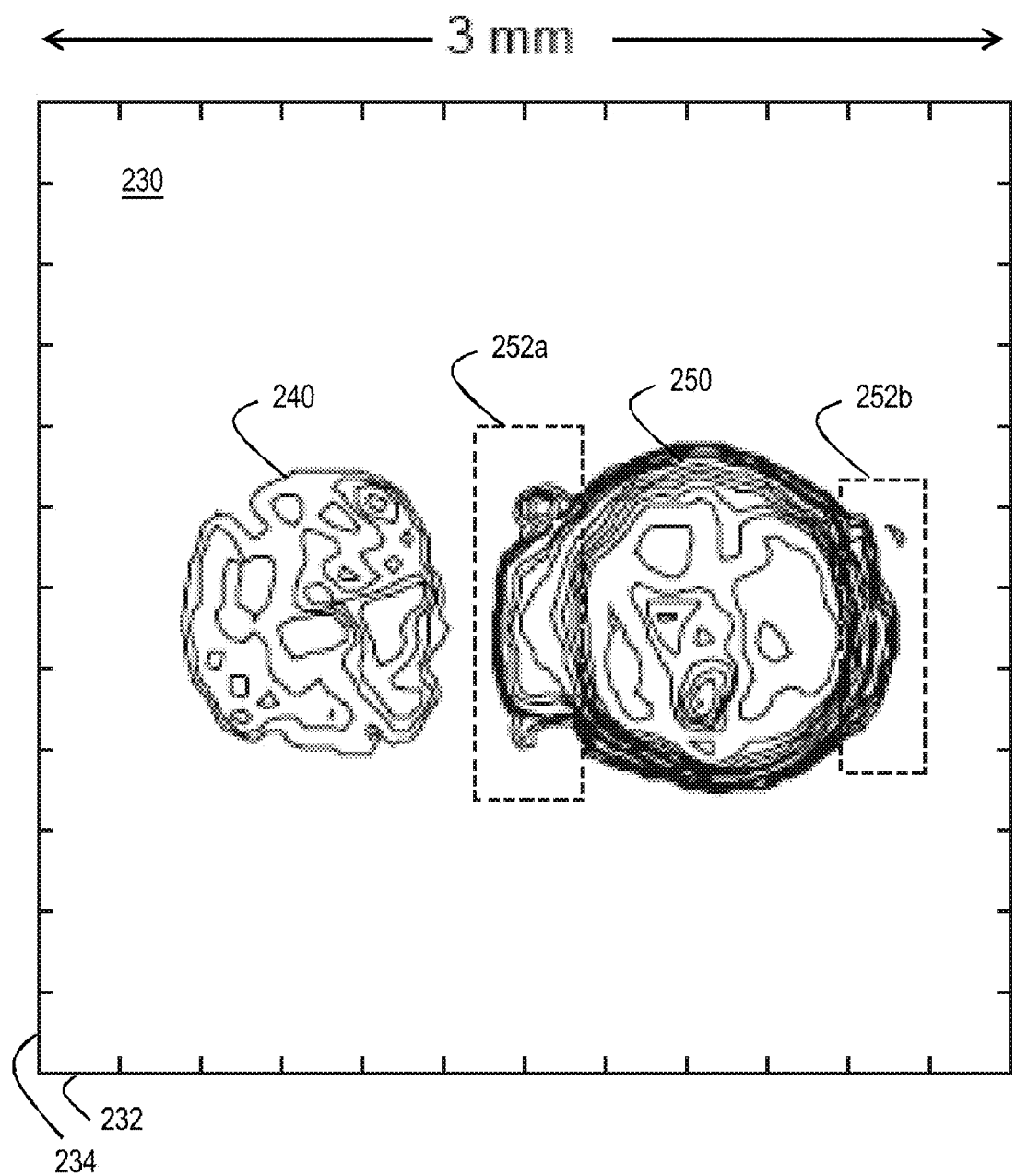
FIG. 2C is a contour plot of an MRI image of a sample of fat tissue.

FIG. 2C is a contour plot of an MRI image 230 of a sample of fat tissue. Image 230 was acquired using a gradient echo technique, well known in the art. The horizontal axis 232 and vertical axis 234 represent image pixel locations extended along 3 millimeters (mm, 1 mm=$10^{-3}$ meters). The image 230 depicts a NMR slice from the center of a cylindrical sample 1 millimeter in diameter and includes two sub-images, sub-image 240 and sub-image 250. The two sub-images are separated by 1.1 mm. The parameters to acquire the image were a slice gradient magnet (Gs) signal of 2.4 Gauss/centimeter×1 millisecond (1 centimeter, cm, =$10^{-2}$ meters; 1 millisecond, ms, =$10^{-3}$ seconds) for slice selection; a frequency encoded gradient magnet (Gf) signal of 4.7 Gauss/cm for frequency encoding, a phase encoded gradient magnet (Gφ) signal of 7.5 Gauss/cm×2 ms with 256 steps for phase encoding; 512 points per FID on a 600 MegaHertz (MHz, 1 MHz=$10^6$ Hertz) and 14 Tesla (T) NMR spectrometer. The image has 512×512 pixels.

The broad separation of fat resonance peaks results in a chemical shift artifact, in which the signals originating from low resonance peaks are misregistered in an image (e.g., image 230) with respect to signals from high resonance peaks. At high field strength, the resonance frequencies of the different fat signals show increased separation, which can further intensify this chemical shift problem. Thus, in FIG. 2C, which is an image generated at high field strength (14 T) and with a small field of view, it is not surprising that the various fat signals were misregistered, resulting in two sub-images. Left sub-image 240 came from resonance peaks 7, 8, 11, and 12 of fat. The small tissue water signal (resonance peak 10) also contributed slightly to this sub-image 240. The right sub-image 250 came from resonance peaks 1, 2, 3, 4, 5, and 6, with the majority of signal generated from the methylene peak 2. The intensity of the left sub-image 240 is approximately 8.5% that of the right sub-image 250. The 1.1 mm separation of the two images is consistent with the 2419 Hz (about 4.03 ppm) distance between vinyl peak 12 and methylene peak 2 in the spectrum at 600 MHz field and with the imaging parameters (applied reading gradient of 1.1 Gauss/cm; acquisition sampling rate 40,000 Hertz). In addition, the spread of the fat resonance peaks 1, 3, 4, 5, and 6 around peak 2 generated extended edges on both sides of the right sub-image (see the areas 252a and 252b in the dashed rectangles on either edge of the right sub-image 250), as evidenced by the shape of right sub-image 250 being elliptical rather than circular. If prior art fat suppression techniques were applied to remove the signal from peak 2, both sub-images would persist, as would the extended edges around the right sub-image.

In general, fat signals can compromise MRI quality by overwhelming the water images in fat-abundant regions. A strong fat signal can also impede the precision of tumor detection by inducing chemical shift artifacts and by obscuring the effects of MRI relaxation agents, which interact only with water. Therefore, fat-suppression and water- or fat-selective imaging have been used in many routine clinical examinations to reduce artifacts and to improve tissue characterization. Prior experimental techniques to achieve these goals include direct presaturation on the large fat methylene peak 2, selective suppression of fat based on the T1 relaxation time difference between water and fat signal, selective excitation of water using selective pulses, and the 'Dixon Method', which works with phase shifts. These methods can be very sensitive to the heterogeneity of the static field $B_0$ and/or the radiofrequency (RF) field $B_1$. Furthermore, the majority of these schemes consider fat to have only a single resonance or assume that all the fat signals have a uniform relaxation time. In reality, fat triglyceride comprises 10 resonance peaks (enumerated peaks 1-8, 11 and 12 in FIG. 2A) that are spread over a chemical shift range of more than 4.4 ppm from the vinyl peak (12) to the methyl peak (1). The strongest peak is the methylene peak 2 on the triglyceride fatty acid chains, excluding those methylene groups that are one bond away from the vinyl group and those one or two bonds away from the carbonyl group. This large methylene peak 2 accounts for approximately 60% of all the fat signals. The remaining 40% of fat signals have been ignored in most fat-suppression techniques; this can induce residual image artifacts and compromise image interpretation. The problem is typically more pronounced at higher magnetic field strengths.

4. Method for Producing Corrected NMR Data

Figure 3:
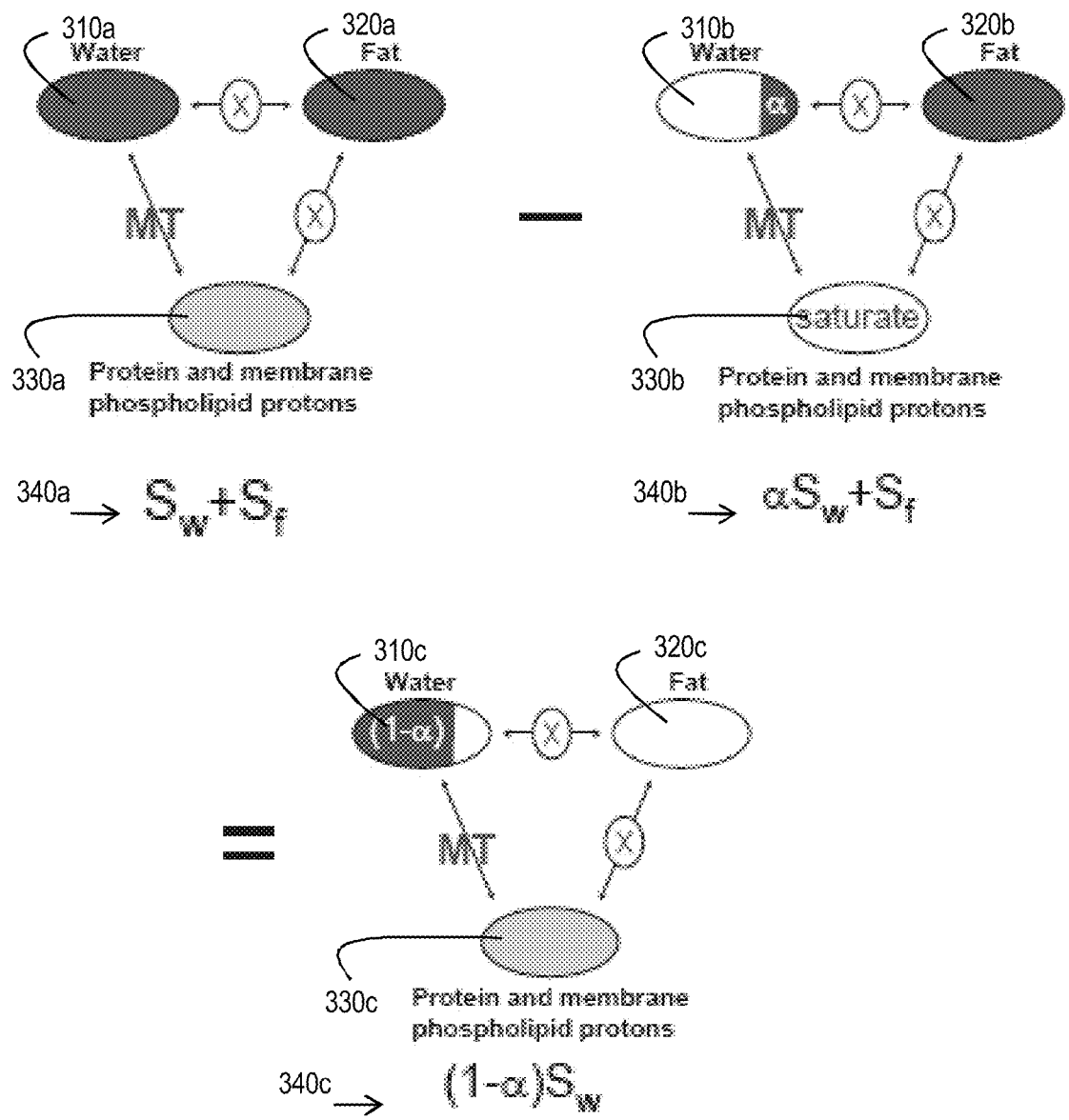
FIG. 3 is a block diagram that illustrates magnetization exchange (also called magnetization transfer, MT) between components of a target tissue, according to an embodiment.

FIG. 3 is a block diagram that illustrates magnetization exchange (also called magnetization transfer, MT) between components of a target tissue, according to an embodiment. FIG. 3 shows the basic magnetization transfer network in tissue for the three components relevant to this approach: water 310a, fat 320a, and protons in tissue protein and membrane phospholipid 330a (the latter comprising the tissue of interest). Magnetization transfer (MT) between fat 320a and water 310a, and between fat 320a and the protons of tissue protein and membrane phospholipid 330a, either do not exist or are extremely weak and not detectable with current NMR methods. In contrast, MT between water 310a and the protons in tissue protein and membrane phospholipid 330a is complex but highly efficient.

It was recognized that this MT network provides an opportunity for presaturation of this tissue proton component 330a (to eliminate its NMR signal) while having no effect on the signal from the fat component 320a. The signal from the water content 310a can be partially or fully eliminated due to near saturation of the water component 310a by magnetization transfer from water 310a to the protons of the tissue protein and membrane phospholipid 330a.

On static state NMR analysis, (e.g., NMR imagery omitting spectral information) the resonance peak from protons in tissue protein and membrane phospholipid has a linewidth that reaches about 20,000 Hz. The signal from protons in this tissue component 330a is thus too broad to be seen in a static NMR signal and does not contribute to the static MRI signal. Selective presaturation of the protons in the protein and membrane phospholipid tissue is easy to implement, for example, by using a low-power, long-time irradiation by $B_1$ at any frequency along the broad spectral resonance frequency of this tissue proton component 330a, as long as the irradiation is not on proton peaks for water or fat components. As shown below, protons in proteins floating in edemas have a linewidth of about 1,500 Hz from the water peak, and can also be selectively saturated or avoided when saturating the protons in other structural tissues.

The method outlined in FIG. 3 is further described using a simple mathematical model. The signal SA of a regular image A schematized by components 310a, 310b and 310c includes signal Sw from water and signal Sf from fat signals as indicated by expression 340a in FIG. 3 and in Equation 4. The signal of the protons in protein and membrane phospholipid component 330a is negligible in the images and typically detectable primarily in the spectra. Thus to first order $$SA = Sw + Sf \quad (4)$$

This image can be acquired using any approach that is best suited to the particular application. Therefore, signals Sw and Sf can be sensitive to water density and fat and water relaxation times.

A second image acquired with the tissue protein and membrane phospholipid protons presaturated is depicted by the nearly saturated water component 310b due to MT, the strong signal from the unsaturated fat component 320b and the saturated protons of the tissue proteins and membrane phospholipid 330b. This presaturation does not change any of the fat signals because there is no magnetization transfer from fat 320b to water 310b or to the tissue proton component 330b. Magnetization transfer from water 310b to the tissue protein and membrane phospholipid protons 330b reduces the water signal to α*Sw, where α describes the proportion of the water signal that remains. Consequently, the signal SB acquired in this stage consists of the full fat signal and a portion of the water signal as indicated by expression 340b in FIG. 3 and in Equation 5

$$SB = \alpha * Sw + Sf \quad (5)$$

Factor α depends on the efficiency of magnetization transfer between water 310b and the tissue protein and membrane phospholipid protons 330b and is determined mainly by the magnetization transfer rate between water and these tissue protons, the relaxation rates of water and these tissue protons, and the irradiation time and intensity of the pulse used to presaturate the tissue proton component 330b. Factor α can be experimentally determined for a specific tissue.

A subtraction of the two images represented by Equation 4 and Equation 5 results in the final image depicted by the nearly unsaturated water component 310c, the eliminated fat component 320c and the negligible unsaturated protons of the tissue proteins and membrane phospholipid 330c. Consequently, the difference signal SC consists of no fat signal and a known portion of the water signal as indicated by expression 340c in FIG. 3 and in Equation 6.

$$SC = (1-\alpha)Sw \quad (6)$$

All the fat signals are eliminated irrespective of their chemical shift. SC reflects the water protons populations hydrating the target tissues and gives an image that reflects the non-fat components of the tissues.

This method is independent of the heterogeneity of the static field $B_0$ or RF field $B_1$. In the water-only image SC that is proportional to $(1-\alpha)$ Sw, the magnetization transfer factor $(1-\alpha)$ provides magnetization transfer contrast in addition to the contrast provided by water density or relaxation time embedded in the image signal Sw.

If the factor α is estimated by an independent experiment, an image that consists only of fat signal can be determined from Eq. (4) and Eq. (5) as $$\alpha SA - SB = (\alpha - 1)Sf \quad (7)$$

This fat-only image contains signals from all fat resonance peaks. If α approaches 0, this calculation is unnecessary; image signal SB is a fat-only image.

The magnetization transfer factor $(1-\alpha)$ in Equation 6 depends on many factors but can be controlled by adjusting the intensity and length of the presaturation pulse. When the presaturation pulse is strong enough and long enough, values of the parameter $(1-\alpha)$ are approximately the same for many tissue types and thus do contribute contrast to the fat-free image. However, under standard imaging conditions, the intensity and length of the presaturation pulse is typically very limited resulting in significantly different magnetization transfer rates for different tissue types; and, under these conditions, enable significant magnetization transfer contrast which was not previously detected in a fat-subtracted image.

This approach for fat-suppression completely eliminates all the fat signals irrespective of their chemical shift frequency; and is insensitive to the heterogeneity of RF field $B_1$ and static field $B_0$. This new approach relies solely on the fact that fat protons do not exchange magnetization with water or with protein and cell membrane phospholipids protons in tissue samples. This method extends the classical MRI magnetization transfer technique and generates a fat-free image that is sensitive to magnetization transfer as well as the tissue water density and relaxation time.

Figure 4:
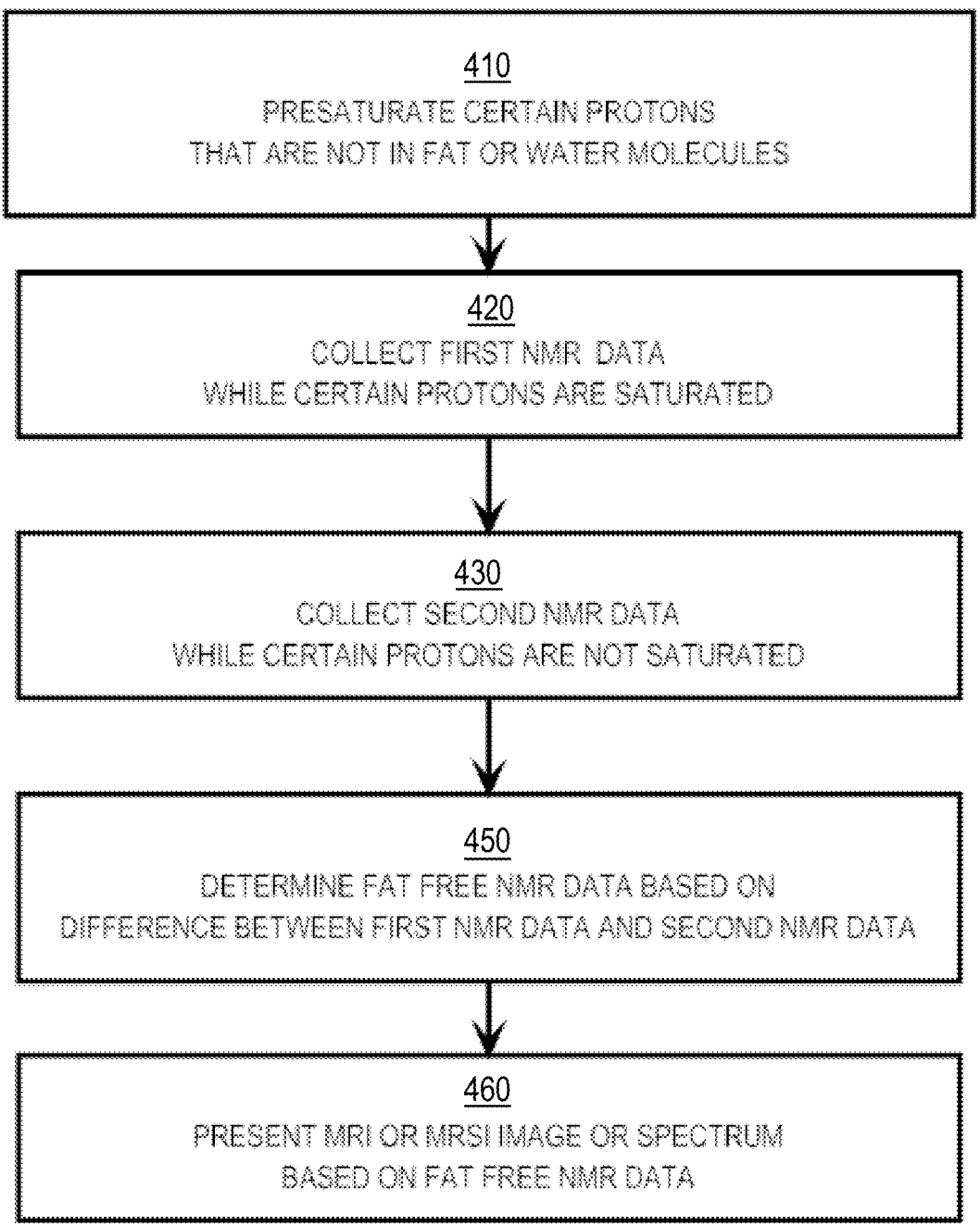
FIG. 4 is a flow chart that illustrates a method for producing corrected NMR data, according to an embodiment.

FIG. 4 is a flow chart that illustrates a method for producing corrected NMR signals, according to an embodiment. Although steps are presented in a particular order for purposes of illustration and explanation, in other embodiments one or more steps may be performed in a different order or overlapping in time, executed in series or in parallel, or one or more steps may be omitted or other steps added or the method changed in some combination of ways.

In step 410, protons in certain molecules are presaturated. The certain protons are not in water or fat molecules, as described in more detail above. In some embodiments the certain protons are in molecules that have a high MT rate with water but a low MT rate with fat molecules, as described above. For example, in an illustrated embodiment, the protons are in proteins or membrane phospholipid molecules. Any known or novel method may be used to presaturate such molecules. For example, in some embodiments protons are saturated using a frequency at about 8.3 ppm (about 4980 Hz) for 5 seconds.

In step 420, a first NMR measurement is made using any technique appropriate for the features of interest. The measurement can be of water intensity, phase difference, relaxation time difference or spectral power in one or more frequency bins, among others. The first measurement is made, however, within a first time while the certain protons are still saturated.

In step 430, the same type or similar type of NMR measurement is made. This second measurement is made, however, within a second time while the certain protons are not saturated. For example, this second measurement is made before presaturating the certain protons; or sometime after the saturated protons have relaxed to a higher population in the lower spin energy state.

In step 450, fat free NMR data (e.g., spectra or imagery of intensity, phase difference, relaxation time difference or MT difference) is determined based on the difference between the first NMR data and the second NMR data. For example, an image based on the first NMR data is subtracted pixel by pixel from an image based on the second NMR data.

In step 460, the NMR data is presented based on the fat-free NMR data. For example, an MRI or MRSI image or spectrum is presented based on the fat-free NMR data. Some experimental embodiments are described in the next section.

The fat-elimination method described is substantially more efficient at suppressing fat signal than the conventional fat-suppression and water- or fat-selective imaging methods. The major methylene signal at peak 2 is the focus of most traditional techniques for fat-suppression, water-selective imaging or fat-selective imaging, while the remaining resonance peaks are ignored. For a regular triglyceride molecule including two double bonds in each of the three chains, the major methylene signal constitutes at most 65% of all the fat signals. Any increase in the double bond content of fat will further reduce the ratio of fat methylene peak to total fat signals in the sample. Therefore, traditional fat-suppression techniques that address only the major methylene signal fail to suppress at least 35% of the signal from fat. In addition, presaturation of a fat resonance peak, which is among the most popular fat-suppression methods, will reduce the water signal intensity because saturation of the major methylene signal also partly saturates protein and membrane phospholipid signal, which triggers magnetization transfer from water.

5. Experimental Embodiments

Experiments were carried out on a Bruker Avance 600 MHz NMR spectrometer (Bruker Biospin, Billerica, Mass., USA) and on a 5 mm probe with x, y, and z triple gradients. The samples were surgically resected human fat tissue and well-differentiated liposarcoma tissue. Specimens were obtained with consent of the patients and with Institutional Review Board approval. Each tissue sample was cut into small pieces. The small pieces were then drawn into a capillary tube (inner diameter 1 mm, outer diameter 1.8 mm) by attaching the capillary to a syringe. In aggregate, these small tissue pieces occupied about a 1 cm length of the capillary tube. One end of the capillary was then sealed with a small piece of polytetrafluoroethylene seal tape. A second capillary filled with $D_2O$ for field-frequency lock was placed parallel with the sample capillary into the 5 mm tube. The samples were maintained at 20° C. during experiments.

The fat-suppression method was applied to both spectra and images. The images were acquired using presaturation and gradient echo with presaturation power off and on, respectively. To clearly illustrate the imaging results, a small field of view was used. For spectroscopy, a 90 degree pulse with presaturation was used. The spectra were acquired using 8 scans, 16,000 data points. The spectrum was acquired on the whole tissue, and the thickness of the image slice was 5.5 mm.

For both imaging and spectroscopy, the RF frequency was at 8.3 ppm for presaturation and was moved to 4.7 ppm for pulsing and data acquisition. The presaturation pulse was 5 seconds long with an intensity of approximately $2.35 \times 10^{-6}$ T.

5.1 Liposarcoma

Figure 5:
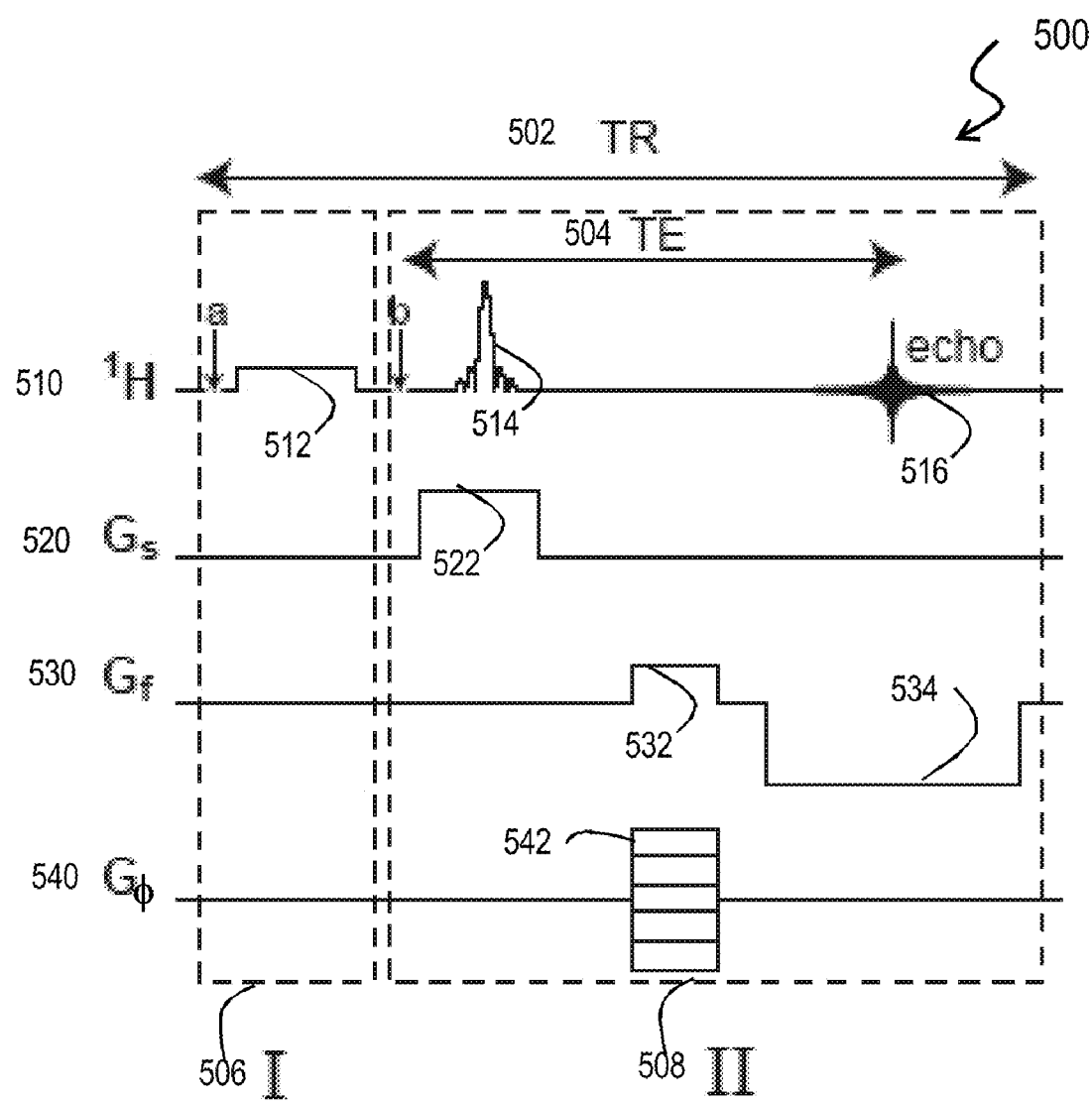
FIG. 5 is a diagram of applied and received fields to apply the method of FIG. 4, according to an embodiment.

FIG. 5 is a diagram of applied and received fields to apply the method of FIG. 4, according to an embodiment. Time intervals TR 502 and TE 504 indicate the repeating time and echo time, respectively. Time interval I 506 indicates the part of pulse sequence for presaturation of tissue protein and membrane phospholipids; and time interval II 508 indicates the part of the pulse sequence for image acquisition. In the illustrated embodiment, time interval II 508 includes an example of a gradient echo; however the gradient echo can be replaced with any imaging sequence in other embodiments. Trace 510 indicates the RF pulses used for imaging including presaturation pulse 512, selective excitation pulse 514 with SINC functional shape; and the detected image signal 516. Traces 520, 530, and 540 indicate gradients for slice-selection, frequency encoding, phase encoding, respectively. Pulse 522 is the slice selection gradient. Pulses 532 and 534 are the dephasing frequency encoding gradient and frequency encoding gradient, respectively. Pulses 542 indicates phase encoding gradients varied from positive maximum $G_\phi$ to negative maximum $G_\phi$. The pulse used to selectively presaturate the tissue protein and membrane phospholipid protons consisted of 250 repetitions of a 10 ms Gaussian pulse followed by a 10 ms blank with total length of 5 seconds and an average intensity of approximately $2.59 \times 10^{-6}$ T for the Gaussian pulse. Two images were acquired, with the presaturation power off and on, to allow for a subtraction to obtain the fat-free image.

Figure 6A:
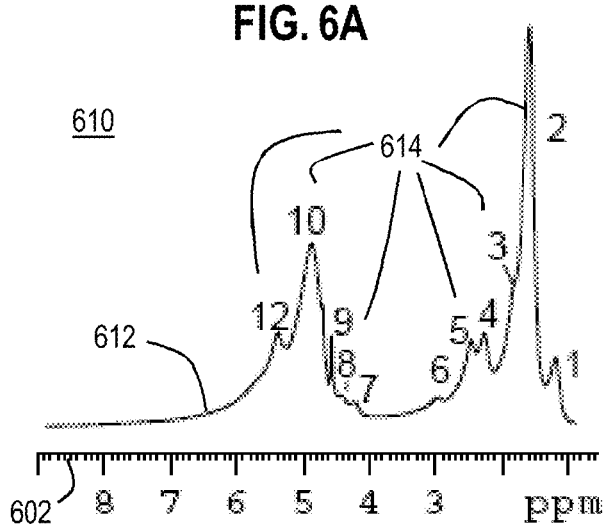

The magnetization transfer methodology for complete fat elimination was applied to a sample of well-differentiated liposarcoma, a tumor type that typically contains triglyceride at a concentration around 5 Molar. FIG. 6A and FIG. 6B and FIG. 6C are graphs that illustrate the NMR spectra and difference, respectively, of two NMR signals from the target tissue, according to another embodiment. For all three graphs, the horizontal axis 602 is frequency in ppm deviation from the driving frequency; and, the vertical axis, not shown, is amplitude in arbitrary units.

In this specimen, the water signal was weaker than the strong fat signal but was large enough to be imaged. The spectra (FIG. 6A-C) illustrate the concept of complete fat-suppression. Spectrum 610 in FIG. 6A was acquired without presaturation and spectrum 620 in FIG. 6B was acquired with 5 seconds presaturation at 8.3 ppm. Spectrum 630 in FIG. 6C, which is the subtraction of spectrum 620 from 610, shows clean elimination of all the fat resonance peaks and leaves a water signal proportional to the population of protons in the tissue proteins and phospholipid.

Figure 6D:
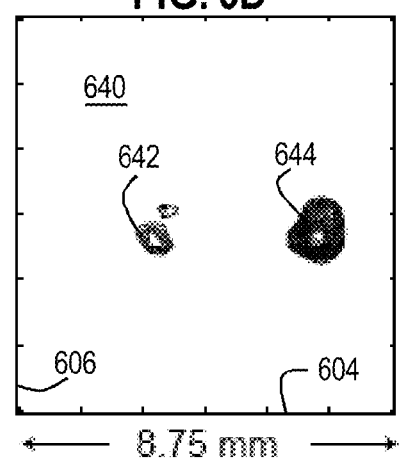
FIG. 6D and FIG. 6E and FIG. 6F are graphs that illustrate the NMR imagery and difference, respectively, of two NMR signals from a target tissue corresponding to FIG. 6A and FIG. 6B and FIG. 6C, respectively, according to another embodiment.
Figure 6B:
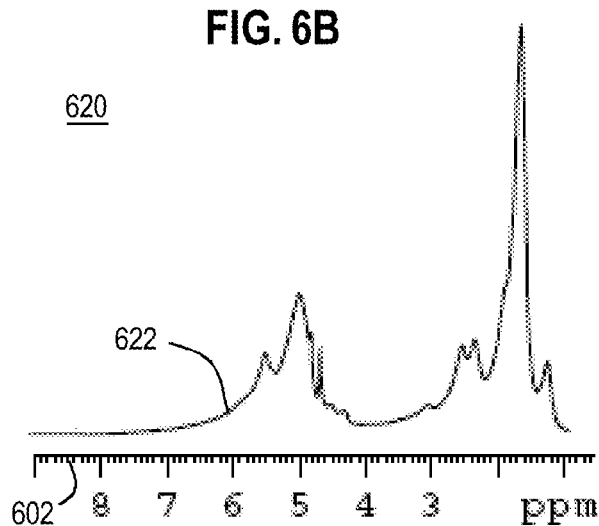
Figure 6E:
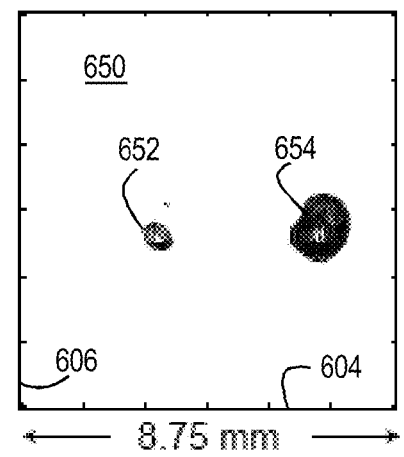
Figure 6F:
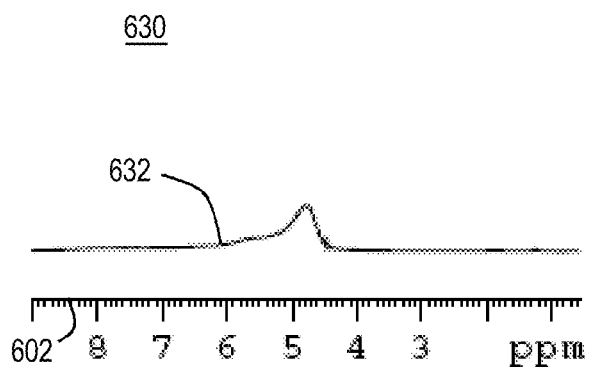
Figure 6F:
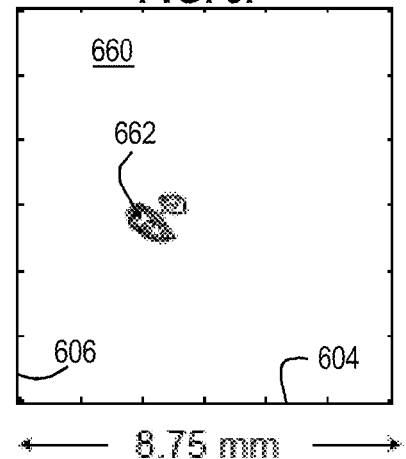

FIG. 6D and FIG. 6E and FIG. 6F are graphs that illustrate the NMR imagery and difference, respectively, of two NMR signals from the target tissue corresponding to FIG. 6A and FIG. 6B and FIG. 6C, respectively, according to another embodiment. For all three graphs, the horizontal axis 604 and vertical axis 606 is distance in mm, with an extent of 8.7 mm. As with the fat sample in FIG. 2C, the liposarcoma sample was misregistered into two sub-images, sub-images 652 and 654 in image 650 with presaturation (FIG. 6E) and sub-images 642 and 644 in image 640 without presaturation (FIG. 6D). However, unlike the fat sample, for which both images were from fat because the sample contained very little water (FIG. 2C), in this well-differentiated liposarcoma the water signal (peak 10) was stronger than the vinyl peak from fat. Thus, the left sub-images 642 and 652 in FIGS. 6D and 6E, respectively, were mainly from water; though the vinyl and the glycerol proton resonance peaks from fat also contributed. The right sub-images 644 and 654 in FIGS. 6D and 6E, respectively, were purely from the fat resonance peaks, mainly from the methylene peak 2 at 1.29 ppm.

The images 640 and 650 show that water signal was not homogeneously distributed spatially inside the tube. It is unknown if this non-homogeneous distribution reflects the true nature of the tissue water or if it resulted from the sample preparation process with two distinct small pieces of liposarcoma tissue residing in an imaging slice from the same axial location in the capillary tube. The image 660 in FIG. 6F is the subtraction of image 650 from image 640. In image 660 the large sub-image 654 from fat was completely eliminated.

5.2 Obese Mouse

The experiments were carried out on an obese mouse (Taconic, model number OB-M-F) under a protocol approved by Memorial Sloan-Kettering Cancer Center RARC (Research Animal Resource Center). Images were acquired on a 7.05-T Bruker Biospec Spectrometer using a birdcage coil. A coronal image was acquired with RARE and presaturation. Imaging parameters included TE=35 ms, TR=2665 ms, field of view 4.2×5.6 cm, matrix 256×256, slice thickness of 1.06 mm, and total imaging time of 20 minutes.

Figure 7A:
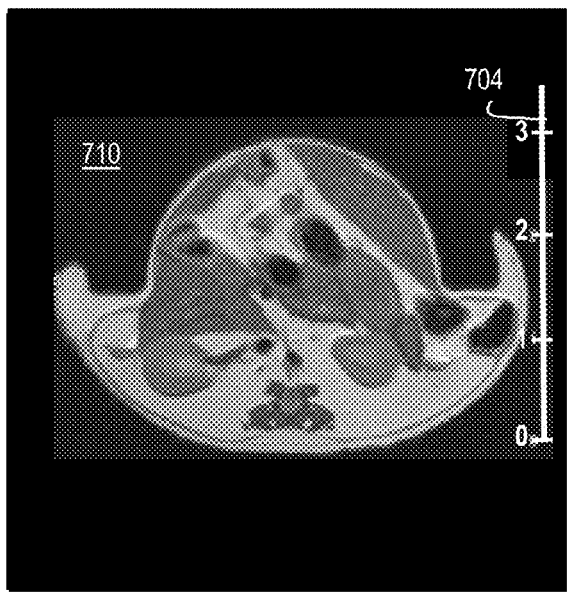
FIG. 7A and FIG. 7B and FIG. 7C are images that illustrate the NMR imagery and difference, respectively, of two NMR signals from an obese mouse, according to another embodiment.
Figure 7B:
Figure 7C:
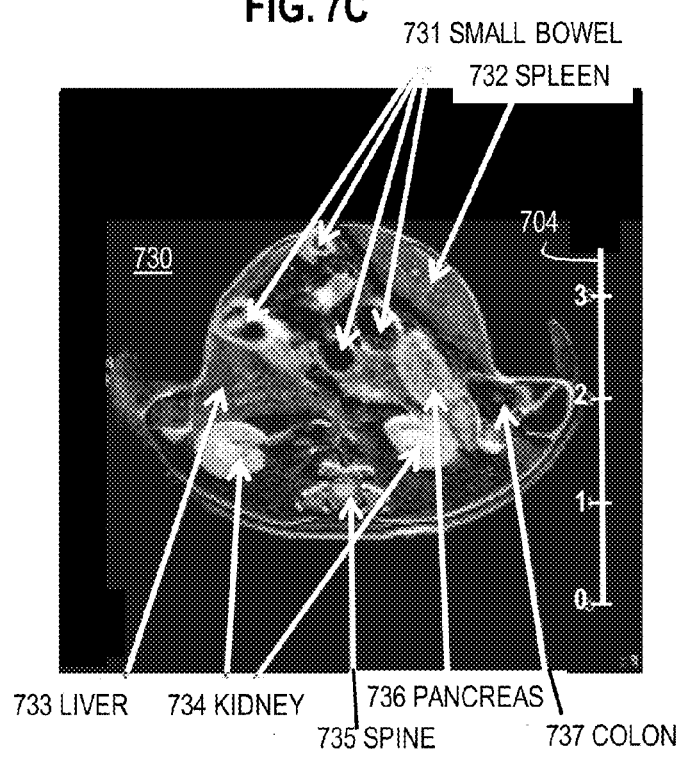

Application of this method on an imaging scanner is straightforward. FIG. 7A and FIG. 7B and FIG. 7C are images that illustrate the NMR imagery and difference, respectively, of two NMR signals from an obese mouse, according to another embodiment. The vertical axis 704 in all three images represents distance in mm; and the horizontal axis, not shown, has the same scale. The distorted external shape of the mouse resulted from using an undersized support structure to contain the oversized obese mouse in the imaging magnet.

FIG. 7A is a regular image 710 acquired using RARE with no presaturation pulse. This image 710 displays large quantities of fat all over the body of the obese mouse. The signal intensities of kidney (see 734 in FIG. 7C) and liver (see 733 in FIG. 7C) are much weaker than that of fat. FIG. 7B depicts image 720 acquired using the same method, but with a pre-saturation pulse. The kidney signal (see 734 in FIG. 7C) was barely detectable, implying that the 5 second irradiation of the tissue protein and membrane phospholipid proton component resulted in very efficient magnetization transfer from water. Image 730 of FIG. 7C is the subtraction of image 720 from image 710. Image brightness/contrast of 730 was increased compared to images 710 and 720. In this fat-free image, fat suppression was uniform and the image contained no imaging artifacts. For kidney 734, the signal intensity of the subtracted image 730 was 85% of the standard image 710. The 15% reduction in signal intensity results from the magnetization transfer factor α and removal of the small fat signal that originates from the low fat levels present in kidney. The signal intensity for liver 733 in image 730 was reduced more than 50% from the standard image because the liver of this obese mouse contained a substantial amount of fat. Other organs clearly visible in image 730 are the small bowel 731, spleen 732, spine 735, pancreas 736 and colon 737.

5.3 Human Tissue

The fat-free imaging technique was implemented on a 3T GE human scanner. FIG. 8A and FIG. 8B are graphs that illustrated uncorrected and corrected NMR imagery for a human subject, according to an embodiment. These images were acquired on a leg of a healthy volunteer using a gradient echo sequence and a knee coil, both well known in the art. FIG. 8A depicts a regular gradient echo image 810; and FIG. 8B depicts the fat-free image 820.

The uniform and complete elimination of all fat signals allow the small septa 822 embedded inside the fat plane to be identified, demonstrating the ability to identify septa in fat. As used herein a septa refers to any wall dividing a cavity or structure into smaller ones.

5.4 Edema Enhancement and Suppression

This same mechanism can be used to enhance and suppress tissue edema even if the edema water signal has the same chemical shift as the tissue water signal. As used herein edema refers to any abnormal accumulation of fluid beneath the skin or in one or more cavities of the body. Compared to tissue, edema contains much less protein and almost no phospholipids. More importantly, edema proteins are in liquid environment and are much more mobile and therefore have a different response to the applied magnetic fields. As a result, protons of edema proteins may still resonate in the range of 0 to 10 ppm, which spreads approximately 1,500 Hz from both sides of a water peak at a field strength of 7 T, while a proton signal of tissue protein and phospholipid can spread about 20,000 Hz due to the large dipolar coupling. Thus, a saturation pulse that is more than 1,500 Hz away from water but within 10,000 Hz can be applied to saturate the tissue proteins and phospholipids but not to affect the protons of the edema proteins. This results in an MT image with reduced tissue water signal due to MT and with full edema water signal. This MT image has an enhanced edema signal. Conversely, edema may be removed and the tissue signal retained by subtracting the MT image from a regular image. The signal from protons in the edema proteins can therefore be suppressed (eliminated with the fat signal) or enhanced (saturated with the protons of the tissue proteins and membrane phospholipid).

Suppression or detection of edema has many useful applications, such as for malignant peripheral nerve sheath tumor (MPNST) or glioma. The following images were acquired on a 7T Bruker scanner with a surface detection coil for the MPNST xenograft and a bird-cage head coil for the mouse glioma. The MPNST xenograft was grown in the upper leg of a mouse and the glioma was induced in the mouse by intracranial injection of transfected DF-1 cells.

FIG. 9A and FIG. 9B and FIG. 9C are graphs that illustrate an NMR image 910, an NMR correction image 920 and difference image 930, respectively, of two NMR signals to distinguish edemas in malignant peripheral nerve sheath tumor (MPNST) tissue, according to another embodiment.

FIG. 10A and FIG. 10B and FIG. 10C are graphs that illustrate an NMR image 1010, an NMR correction image 1020 and difference image 1030, respectively, of two NMR signals to distinguish edemas in glioma, according to another embodiment.

Images 910 and 1010 and images 920 and 1020 were acquired with RARE, the latter image 920 and 1020 with a presaturation pulse of 5 seconds and 5000 Hz away from water. The saturation power for images 910 and 1010 was zero and for images 920 and 1020 was approximately 120 Hz.

It is worthy to note that this method can be used to produce an edema-enhanced image such as image 920 or 1020, as well as an edema-free image such as image 930 or 1030.

For MPNST xenografts, there was edema around the tumor and a core of fat inside the tumor. In the regular T2-weighted image 910 acquired with RARE, it was not easy to identify the tumor margin; and edema might be interpreted as an infiltrative tumor. The off-resonance presaturation does not saturate the edema in the MT-RARE image. Thus, in the subtracted images, the edema was completely removed. In the edema-free image, the tumor 932 is evident; the tumor margin was nicely recognizable and the tumor size can be easily measured. Thus, this edema elimination method would enable more accurate prediction of tumor extent which would be important for surgical planning.

While the edema suppressed image 930 helps isolate a tumor in MPNST, the edema enhanced image 1020 helps indicate the glioma. In the glioma case, the edema may be read as the tumor in a regular T2-weighted image 1010. Edema 1022 is readily distinguished with significantly enhanced contrast in image 1020 for the tumor bearing mouse, because in image 1020 both the regular tissue and tumor were suppressed.

6. Anticipated Embodiments

The correction approach depicted in FIG. 4 offers several advantages. As shown in FIG. 7C of the obese mouse, this method retained 85% of the kidney signal intensity. For most tissues other than fat, magnetization transfer from water to protein and membrane phospholipid protons is very efficient ($\alpha$ is very small), and thus in most tissues very little water signal is lost. Furthermore, the elimination of the fat signal does not depend on the chemical shift or the linewidth of the fat signals, and it is not affected by the heterogeneity of static field $B_0$ or RF field $B_1$. The magnetization exchange method can be utilized for any magnetic field strength, and an increase in magnetic field strength does not require any further modification to the approach. Furthermore, this approach can be combined with other MR imaging techniques. For example, for the optimal imaging of tumors, it is expected that the fat-free imaging method will be incorporated into the standard Fast Spin Echo sequence used for conventional tumor imaging, which involves software modification by the manufacturer.

The approach does involve a 2-fold increase in imaging time, as is typical for other fat-suppression techniques. However, the acquired water-only-image provides additional information, as it is now sensitive to magnetization transfer in addition to the tissue water density or relaxation time. Magnetization transfer imaging is a well-developed methodology and has been found useful in many applications such as magnetic resonance angiography, breast imaging, brain metabolism and multiple sclerosis. The fat-free imaging method presented in this work retains all the advantages of traditional magnetization transfer contrast. It should further enhance contrast for more precise tissue characterization and tumor delineation, particularly for tumors arising in regions of high fat content such as the retroperitoneal space.

Thus, potential applications of MT imaging with saturation of protein protons include, among others: 1] improved detection and delineation of tumors such as liposarcoma; 2] improved prediction of tumor response to therapy; 3] improved detection of breast cancer by more precise and uniform suppression of obscuring signals from surrounding normal fat tissue in the breast; 4] improved accuracy of the extent of edema versus tumor, for example, in brain cancer; 5] improved detection of the extent of an infarction and/or edema in stroke patients; 6] improved evaluation of the extent of fat content in liver following chemotherapy (which would help select best candidates for liver resection following chemotherapy); 7] enabled non-invasive evaluation of the amount of myelin deposition in neurodegenerative diseases; 8] improved detection of the extent of sarcomas, such as myxofibrosarcoma that can extend as sheets of cells along fascial planes; 9] increased precision in detecting the extent of inflammation in diseases such as arthritis; 10] improved detection of retroperitoneal tumors through suppression of unwanted signals from retroperitoneal fat; and, 11] improved detection of bone marrow abnormalities by suppression of unwanted signals from bone marrow fat. In medicine, an infarction is the process of tissue death (necrosis) caused by blockage of the tissue's blood supply. The supplying artery may be blocked by an obstruction (e.g. an embolus, thrombus, or atherosclerotic plaque), may be mechanically compressed (e.g. tumor, volvulus, or hernia), ruptured by trauma (e.g. atherosclerosis or vasculitides), or vasoconstricted (e.g. cocaine vasoconstriction leading to myocardial infarction). Infarctions are commonly associated with hypertension or atherosclerosis. In atherosclerotic formations a plaque develops under a fibrous cap.

7. Computer Hardware Overview

The processes described herein for providing corrected NMR imaging may be advantageously implemented via software, hardware (e.g., general processor, Digital Signal Processing (DSP) chip, an Application Specific Integrated Circuit (ASIC), Field Programmable Gate Arrays (FPGAs), etc.), firmware or a combination thereof. Such exemplary hardware for performing the described functions is detailed below.

Figure 11:
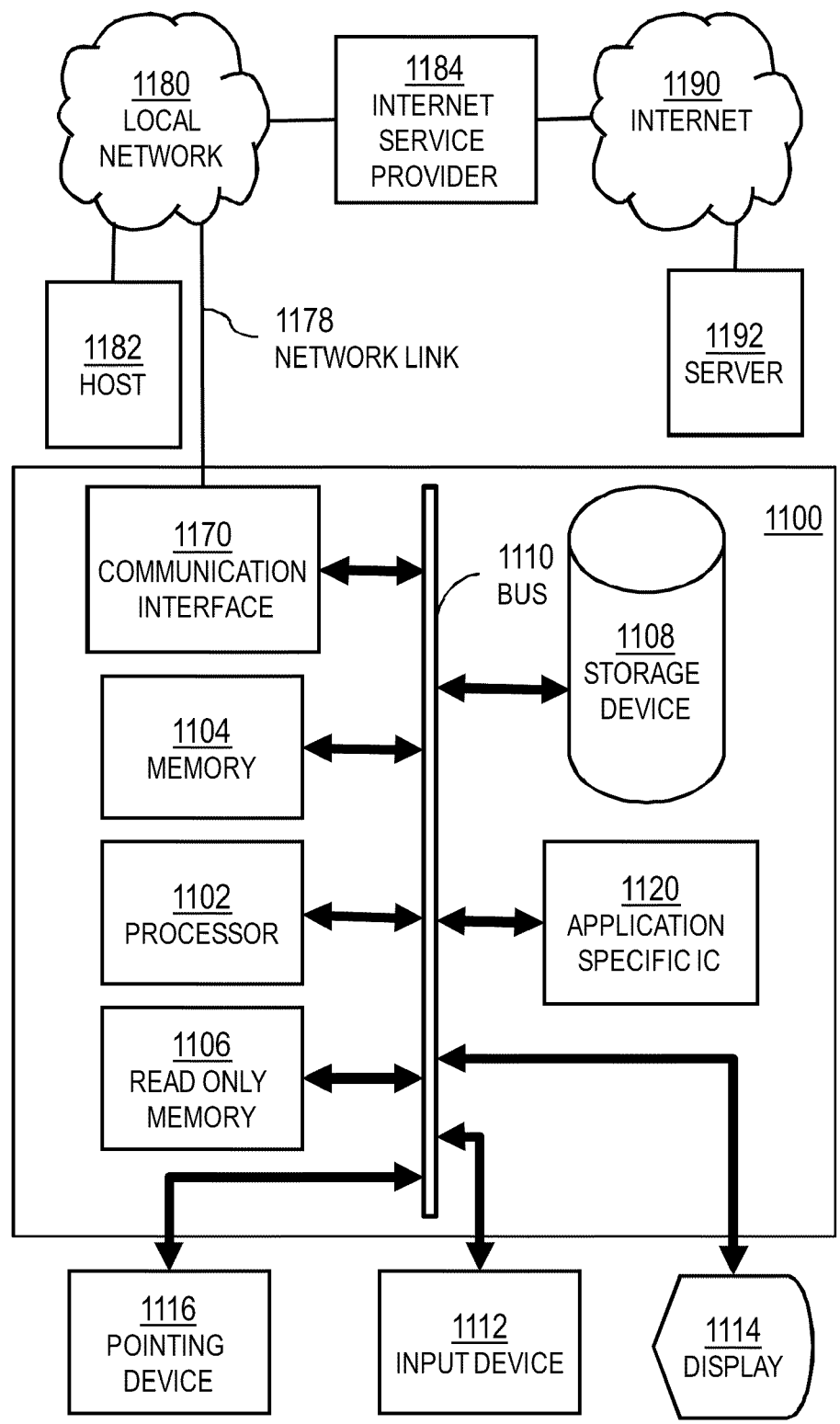
FIG. 11 is a block diagram that illustrates a computer system upon which an embodiment of the invention may be implemented.
Figure 12:
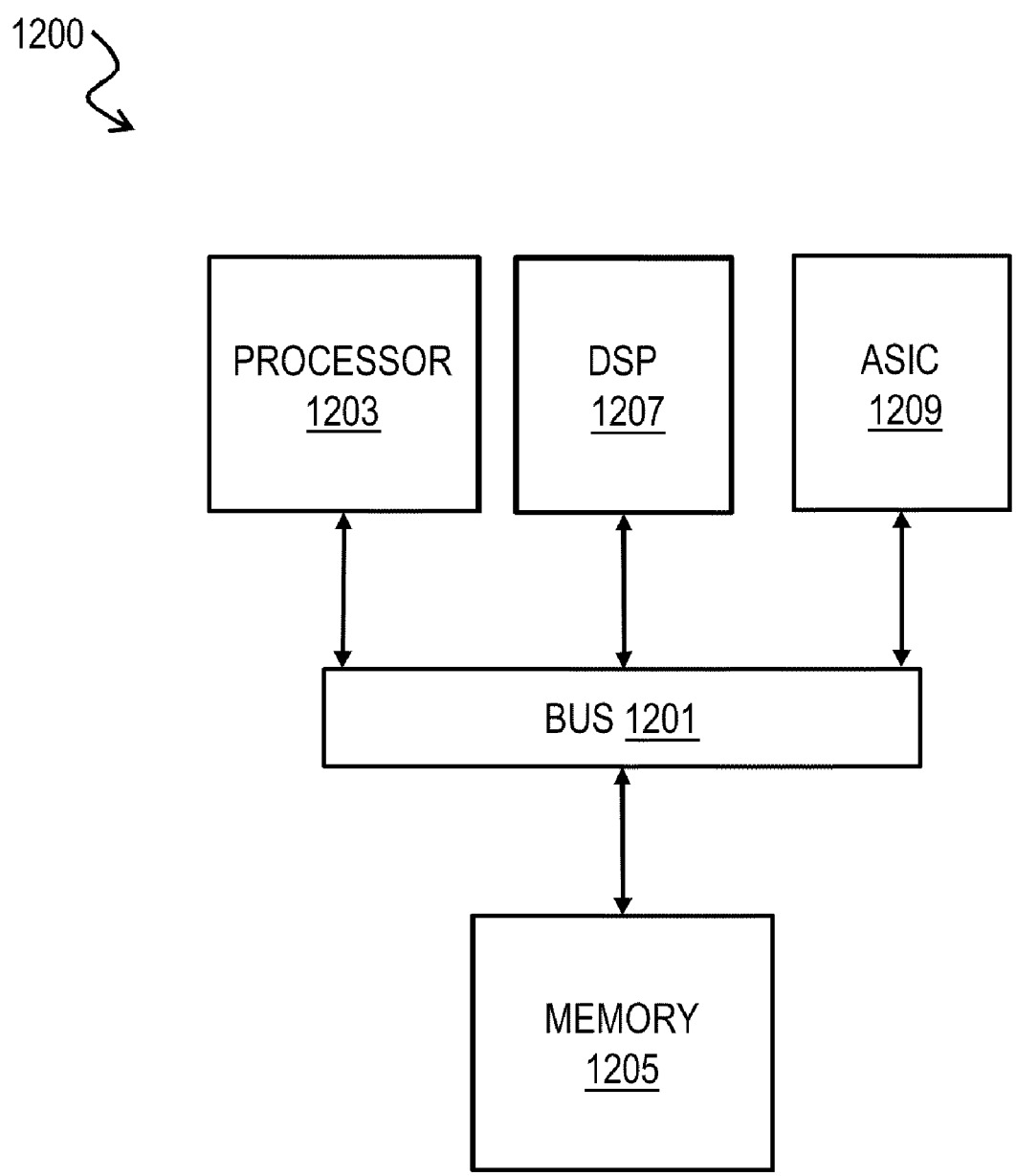
FIG. 12 is a block diagram of illustrates a chip set upon which an embodiment of the invention may be implemented.

FIG. 11 illustrates a computer system 1100 upon which an embodiment of the invention may be implemented. Although computer system 1100 is depicted with respect to a particular device or equipment, it is contemplated that other devices or equipment (e.g., network elements, servers, etc.) within FIG. 11 can deploy the illustrated hardware and components of system 1100. Computer system 1100 is programmed (e.g., via computer program code or instructions) to provide corrected NMR imaging as described herein and includes a communication mechanism such as a bus 1110 for passing information between other internal and external components of the computer system 1100. Information (also called data) is represented as a physical expression of a measurable phenomenon, typically electric voltages, but including, in other embodiments, such phenomena as magnetic, electromagnetic, pressure, chemical, biological, molecular, atomic, subatomic and quantum interactions. For example, north and south magnetic fields, or a zero and non-zero electric voltage, represent two states (0, 1) of a binary digit (bit). Other phenomena can represent digits of a higher base. A superposition of multiple simultaneous quantum states before measurement represents a quantum bit (qubit). A sequence of one or more digits constitutes digital data that is used to represent a number or code for a character. In some embodiments, information called analog data is represented by a near continuum of measurable values within a particular range. Computer system 1100, or a portion thereof, constitutes a means for performing one or more steps of providing corrected NMR imaging.

A bus 1110 includes one or more parallel conductors of information so that information is transferred quickly among devices coupled to the bus 1110. One or more processors 1102 for processing information are coupled with the bus 1110.

A processor 1102 performs a set of operations on information as specified by computer program code related to providing corrected NMR imaging. The computer program code is a set of instructions or statements providing instructions for the operation of the processor and/or the computer system to perform specified functions. The code, for example, may be written in a computer programming language that is compiled into a native instruction set of the processor. The code may also be written directly using the native instruction set (e.g., machine language). The set of operations include bringing information in from the bus 1110 and placing information on the bus 1110. The set of operations also typically include comparing two or more units of information, shifting positions of units of information, and combining two or more units of information, such as by addition or multiplication or logical operations like OR, exclusive OR (XOR), and AND. Each operation of the set of operations that can be performed by the processor is represented to the processor by information called instructions, such as an operation code of one or more digits. A sequence of operations to be executed by the processor 1102, such as a sequence of operation codes, constitute processor instructions, also called computer system instructions or, simply, computer instructions. Processors may be implemented as mechanical, electrical, magnetic, optical, chemical or quantum components, among others, alone or in combination.

Computer system 1100 also includes a memory 1104 coupled to bus 1110. The memory 1104, such as a random access memory (RAM) or other dynamic storage device, stores information including processor instructions for corrected NMR imaging. Dynamic memory allows information stored therein to be changed by the computer system 1100. RAM allows a unit of information stored at a location called a memory address to be stored and retrieved independently of information at neighboring addresses. The memory 1104 is also used by the processor 1102 to store temporary values during execution of processor instructions. The computer system 1100 also includes a read only memory (ROM) 1106 or other static storage device coupled to the bus 1110 for storing static information, including instructions, that is not changed by the computer system 1100. Some memory is composed of volatile storage that loses the information stored thereon when power is lost. Also coupled to bus 1110 is a non-volatile (persistent) storage device 1108, such as a magnetic disk, optical disk or flash card, for storing information, including instructions, that persists even when the computer system 1100 is turned off or otherwise loses power.

Information, including instructions for corrected NMR imaging, is provided to the bus 1110 for use by the processor from an external input device 1112, such as a keyboard containing alphanumeric keys operated by a human user, or a sensor. A sensor detects conditions in its vicinity and transforms those detections into physical expression compatible with the measurable phenomenon used to represent information in computer system 1100. Other external devices coupled to bus 1110, used primarily for interacting with humans, include a display device 1114, such as a cathode ray tube (CRT) or a liquid crystal display (LCD), or plasma screen or printer for presenting text or images, and a pointing device 1116, such as a mouse or a trackball or cursor direction keys, or motion sensor, for controlling a position of a small cursor image presented on the display 1114 and issuing commands associated with graphical elements presented on the display 1114. In some embodiments, for example, in embodiments in which the computer system 1100 performs all functions automatically without human input, one or more of external input device 1112, display device 1114 and pointing device 1116 is omitted.

In the illustrated embodiment, special purpose hardware, such as an application specific integrated circuit (ASIC) 1120, is coupled to bus 1110. The special purpose hardware is configured to perform operations not performed by processor 1102 quickly enough for special purposes. Examples of application specific ICs include graphics accelerator cards for generating images for display 1114, cryptographic boards for encrypting and decrypting messages sent over a network, speech recognition, and interfaces to special external devices, such as robotic arms and medical scanning equipment that repeatedly perform some complex sequence of operations that are more efficiently implemented in hardware.

Computer system 1100 also includes one or more instances of a communications interface 1170 coupled to bus 1110. Communication interface 1170 provides a one-way or two-way communication coupling to a variety of external devices that operate with their own processors, such as printers, scanners and external disks. In general the coupling is with a network link 1178 that is connected to a local network 1180 to which a variety of external devices with their own processors are connected. For example, communication interface 1170 may be a parallel port or a serial port or a universal serial bus (USB) port on a personal computer. In some embodiments, communications interface 1170 is an integrated services digital network (ISDN) card or a digital subscriber line (DSL) card or a telephone modem that provides an information communication connection to a corresponding type of telephone line. In some embodiments, a communication interface 1170 is a cable modem that converts signals on bus 1110 into signals for a communication connection over a coaxial cable or into optical signals for a communication connection over a fiber optic cable. As another example, communications interface 1170 may be a local area network (LAN) card to provide a data communication connection to a compatible LAN, such as Ethernet. Wireless links may also be implemented. For wireless links, the communications interface 1170 sends or receives or both sends and receives electrical, acoustic or electromagnetic signals, including infrared and optical signals, that carry information streams, such as digital data. For example, in wireless handheld devices, such as mobile telephones like cell phones, the communications interface 1170 includes a radio band electromagnetic transmitter and receiver called a radio transceiver. In certain embodiments, the communications interface 1170 enables connection to a communication network.

The term "computer-readable medium" as used herein to refers to any medium that participates in providing information to processor 1102, including instructions for execution.

Such a medium may take many forms, including, but not limited to computer-readable storage medium (e.g., non-volatile media, volatile media), and transmission media. Non-transitory media, such as non-volatile media, include, for example, optical or magnetic disks, such as storage device 1108. Volatile media include, for example, dynamic memory 1104. Transmission media include, for example, coaxial cables, copper wire, fiber optic cables, and carrier waves that travel through space without wires or cables, such as acoustic waves and electromagnetic waves, including radio, optical and infrared waves. Signals include man-made transient variations in amplitude, frequency, phase, polarization or other physical properties transmitted through the transmission media. Common forms of computer-readable media include, for example, a floppy disk, a flexible disk, hard disk, magnetic tape, any other magnetic medium, a CD-ROM, CDRW, DVD, any other optical medium, punch cards, paper tape, optical mark sheets, any other physical medium with patterns of holes or other optically recognizable indicia, a RAM, a PROM, an EPROM, a FLASH-EPROM, any other memory chip or cartridge, a carrier wave, or any other medium from which a computer can read. The term computer-readable storage medium is used herein to refer to any computer-readable medium except transmission media.

Logic encoded in one or more tangible media includes one or both of processor instructions on a computer-readable storage media and special purpose hardware, such as ASIC 1120.

Network link 1178 typically provides information communication using transmission media through one or more networks to other devices that use or process the information. For example, network link 1178 may provide a connection through local network 1180 to a host computer 1182 or to equipment 1184 operated by an Internet Service Provider (ISP). ISP equipment 1184 in turn provides data communication services through the public, world-wide packet-switching communication network of networks now commonly referred to as the Internet 1190.

A computer called a server host 1192 connected to the Internet hosts a process that provides a service in response to information received over the Internet. For example, server host 1192 hosts a process that provides information representing video data for presentation at display 1114. It is contemplated that the components of system 1100 can be deployed in various configurations within other computer systems, e.g., host 1182 and server 1192.

At least some embodiments of the invention are related to the use of computer system 1100 for implementing some or all of the techniques described herein. According to one embodiment of the invention, those techniques are performed by computer system 1100 in response to processor 1102 executing one or more sequences of one or more processor instructions contained in memory 1104. Such instructions, also called computer instructions, software and program code, may be read into memory 1104 from another computer-readable medium such as storage device 1108 or network link 1178. Execution of the sequences of instructions contained in memory 1104 causes processor 1102 to perform one or more of the method steps described herein. In alternative embodiments, hardware, such as ASIC 1120, may be used in place of or in combination with software to implement the invention. Thus, embodiments of the invention are not limited to any specific combination of hardware and software, unless otherwise explicitly stated herein.

The signals transmitted over network link 1178 and other networks through communications interface 1170, carry information to and from computer system 1100. Computer system 1100 can send and receive information, including program code, through the networks 1180, 1190 among others, through network link 1178 and communications interface 1170. In an example using the Internet 1190, a server host 1192 transmits program code for a particular application, requested by a message sent from computer 1100, through Internet 1190, ISP equipment 1184, local network 1180 and communications interface 1170. The received code may be executed by processor 1102 as it is received, or may be stored in memory 1104 or in storage device 1108 or other non-volatile storage for later execution, or both. In this manner, computer system 1100 may obtain application program code in the form of signals on a carrier wave.

Various forms of computer readable media may be involved in carrying one or more sequence of instructions or data or both to processor 1102 for execution. For example, instructions and data may initially be carried on a magnetic disk of a remote computer such as host 1182. The remote computer loads the instructions and data into its dynamic memory and sends the instructions and data over a telephone line using a modem. A modem local to the computer system 1100 receives the instructions and data on a telephone line and uses an infra-red transmitter to convert the instructions and data to a signal on an infra-red carrier wave serving as the network link 1178. An infrared detector serving as communications interface 1170 receives the instructions and data carried in the infrared signal and places information representing the instructions and data onto bus 1110. Bus 1110 carries the information to memory 1104 from which processor 1102 retrieves and executes the instructions using some of the data sent with the instructions. The instructions and data received in memory 1104 may optionally be stored on storage device 1108, either before or after execution by the processor 1102.

FIG. 12 illustrates a chip set 1200 upon which an embodiment of the invention may be implemented. Chip set 1200 is programmed to provide corrected NMR imaging as described herein and includes, for instance, the processor and memory components described with respect to FIG. 11 incorporated in one or more physical packages (e.g., chips). By way of example, a physical package includes an arrangement of one or more materials, components, and/or wires on a structural assembly (e.g., a baseboard) to provide one or more characteristics such as physical strength, conservation of size, and/or limitation of electrical interaction. It is contemplated that in certain embodiments the chip set can be implemented in a single chip. Chip set 1200, or a portion thereof, constitutes a means for performing one or more steps of corrected NMR imaging.

In one embodiment, the chip set 1200 includes a communication mechanism such as a bus 1201 for passing information among the components of the chip set 1200. A processor 1203 has connectivity to the bus 1201 to execute instructions and process information stored in, for example, a memory 1205. The processor 1203 may include one or more processing cores with each core configured to perform independently. A multi-core processor enables multiprocessing within a single physical package. Examples of a multi-core processor include two, four, eight, or greater numbers of processing cores. Alternatively or in addition, the processor 1203 may include one or more microprocessors configured in tandem via the bus 1201 to enable independent execution of instructions, pipelining, and multithreading. The processor 1203 may also be accompanied with one or more specialized components to perform certain processing functions and tasks such as one or more digital signal processors (DSP) 1207, or one or more application-specific integrated circuits (ASIC) 1209. A DSP 1207 typically is configured to process real-world signals (e.g., sound) in real time independently of the processor 1203. Similarly, an ASIC 1209 can be configured to performed specialized functions not easily performed by a general purposed processor. Other specialized components to aid in performing the inventive functions described herein include one or more field programmable gate arrays (FPGA) (not shown), one or more controllers (not shown), or one or more other special-purpose computer chips.

The processor 1203 and accompanying components have connectivity to the memory 1205 via the bus 1201. The memory 1205 includes both dynamic memory (e.g., RAM, magnetic disk, writable optical disk, etc.) and static memory (e.g., ROM, CD-ROM, etc.) for storing executable instructions that when executed perform the inventive steps described herein to provide corrected NMR imaging The memory 1205 also stores the data associated with or generated by the execution of the inventive steps 8. Extensions and Alternations In the foregoing specification, the invention has been described with reference to specific embodiments thereof. It will, however, be evident that various modifications and changes may be made thereto without departing from the broader spirit and scope of the invention. The specification and drawings are, accordingly, to be regarded in an illustrative rather than a restrictive sense.

What is claimed is:

1. A method comprising:
   applying, with a nuclear magnetic resonance device, a presaturation radio frequency (RF) magnetic field at a particular frequency different from a fat molecule resonance for a particular time to a target tissue;
   applying, with a nuclear magnetic resonance device, a first measurement RF magnetic field within a first time after the particular time; and
   determining correction nuclear magnetic resonance data indicating content of a species from the target tissue based on first nuclear magnetic resonance data received in response to applying the first measurement RF magnetic field.

2. The method as recited in claim 1, further comprising determining certain tissue protons that are in a target tissue but are not in a triglyceride molecule and not in a water molecule, and with which certain protons water molecules exchange magnetization more effectively than protons in triglyceride molecules exchange magnetization;
   determining the particular frequency and the particular time to presaturate the certain tissue protons; and
   determining the first time during which the certain protons remain saturated wherein the correction nuclear magnetic resonance data indicates a fat content.

3. The method as recited in claim 1, further comprising determining certain tissue protons that are in a target tissue and edema protons that are in an edematous tissue; and
   determining the particular frequency and the particular time to presaturate the certain tissue protons but not to presaturate the edema protons; and
   determining the first time during which the certain tissue protons remain saturated wherein the correction nuclear magnetic resonance data indicates an edema.

4. The method as recited in claim 1, the method further comprising:
   applying a second measurement RF magnetic field in a second time that is different from both the particular time and the first time; and
   determining corrected nuclear magnetic resonance data by subtracting the correction nuclear magnetic resonance data from second nuclear magnetic resonance data received in response to applying the second measurement RF magnetic field.

5. The method as recited in claim 4, wherein during the second time the tissue protons are not saturated.

6. The method as recited in claim 4, wherein the second measurement RF magnetic field is substantively equivalent to the first measurement RF magnetic field.

7. The method as recited in claim 2, wherein the certain tissue protons are in protein molecules.

8. The method as recited in claim 2, wherein the certain tissue protons are in membrane phospholipid molecules.

9. The method as recited in claim 1, wherein the particular frequency is in a range from about 0 Hertz to about 20,000 Hertz from a water peak.

10. The method as recited in claim 9, wherein the particular frequency is in a range from about 1,500 Hertz to about 20,000 Hertz from a water peak.

11. The method as recited in claim 9, wherein the particular frequency is in a range from about 0 Hertz to about 1,500 Hertz from a water peak.

12. The method as recited in claim 1, wherein the particular time is about five seconds in duration.

13. The method as recited in claim 4, wherein the method detects a detailed structure among fatty tissues in a subject based on the corrected nuclear magnetic resonance data.

14. The method as recited in claim 4, wherein the method detects an abnormal structure among fatty tissues in a subject based on the corrected nuclear magnetic resonance data.

15. The method as recited in claim 4, wherein the method detects a structure within an edema in a subject based on the corrected nuclear magnetic resonance data.

16. The method as recited in claim 13, wherein the detailed structure is a member selected from a group comprising septa, edema, liposarcomas, breast tumors, brain tumors, infarcted or necrotic tissues, liver pathologies, myelin deposition, sarcomas, inflamed tissues, retroperitoneal tumors, and bone marrow abnormalities.

17. An apparatus comprising:
    means for applying a presaturation radio frequency (RF) magnetic field at a particular frequency different from a fat molecule resonance for a particular time to a target tissue;
    means for applying a first measurement RF magnetic field within a first time after the particular time; and
    means for determining correction nuclear magnetic resonance data from the target tissue based on first nuclear magnetic resonance data received in response to applying the first measurement RF magnetic field.

18. The apparatus as recited in claim 17, further comprising:
    means for applying a second measurement RF magnetic field in a second time that is different from both the particular time and the first time; and
    means for determining corrected nuclear magnetic resonance data by subtracting the correction nuclear magnetic resonance data from second nuclear magnetic resonance data received in response to applying the second measurement RF magnetic field.

19. An apparatus comprising:
a first magnetic coil for applying a steady state magnetic field B0 to a subject;
a second magnetic coil and driver for applying a plurality of radio frequency (RF) magnetic fields to the subject;
a RF receiver;
a controller configured to
  drive the second magnetic coil to apply a presaturation RF magnetic field at a particular frequency different from a fat molecule resonance for a particular time to the subject, and
  drive the second magnetic coil to apply a first measurement RF magnetic field within a first time after the particular time; and
a processor configured to determine correction nuclear magnetic resonance data from the subject based on first nuclear magnetic resonance data receive at the RF receiver in response to applying the first measurement RF magnetic field.

20. The apparatus as recited in claim 19, wherein:
the controller is further configured to drive the second magnetic coil to apply a second measurement RF magnetic field in a second time that is different from both the particular time and the first time; and
the processor is further configured to determine corrected nuclear magnetic resonance data by subtracting the correction nuclear magnetic resonance data from second nuclear magnetic resonance data received at the RF receiver in response to applying the second measurement RF magnetic field.

21. A non-transitory computer-readable medium carrying one or more sequences of instructions, wherein execution of the one or more sequences of instructions by one or more processors causes an apparatus to perform:
  applying a presaturation radio frequency (RF) magnetic field at a particular frequency different from a fat molecule resonance for a particular time to a target tissue;
  applying a first measurement RF magnetic field within a first time after the particular time; and
  determining correction nuclear magnetic resonance data from the target tissue based on first nuclear magnetic resonance data received in response to applying the first measurement RF magnetic field.

22. The non-transitory computer-readable medium recited in claim 21, wherein execution of the one or more sequences of instructions by the one or more processors further causes an apparatus to perform:
  applying a second measurement RF magnetic field in a second time that is different from both the particular time and the first time; and
  determining corrected nuclear magnetic resonance data by subtracting the correction nuclear magnetic resonance data from second nuclear magnetic resonance data received in response to applying the second measurement RF magnetic field.

* * * * *